(12) United States Patent
Shiomi et al.

(10) Patent No.: US 8,033,288 B2
(45) Date of Patent: Oct. 11, 2011

(54) SUBSTRATE TREATMENT APPARATUS

(75) Inventors: Akio Shiomi, Kyoto (JP); Yoshihiro Nishina, Kyoto (JP); Toru Sato, Kyoto (JP); Ryo Muramoto, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 459 days.

(21) Appl. No.: 12/043,561

(22) Filed: Mar. 6, 2008

(65) Prior Publication Data

US 2008/0216880 A1 Sep. 11, 2008

(30) Foreign Application Priority Data

Mar. 9, 2007 (JP) ................................ 2007-060779
Mar. 9, 2007 (JP) ................................ 2007-060780
Dec. 12, 2007 (JP) ................................ 2007-321142

(51) Int. Cl.
*B08B 3/04* (2006.01)

(52) U.S. Cl. ............ 134/66; 134/78; 134/157; 134/902; 414/222.01

(58) Field of Classification Search ................ 134/56 R, 134/66, 78, 157, 902; 414/222.01
See application file for complete search history.

(56) References Cited

U.S. PATENT DOCUMENTS

| | | | |
|---|---|---|---|
| 4,987,407 A * | 1/1991 | Lee ................. | 340/540 |
| 6,009,890 A | 1/2000 | Kaneko et al. | |
| 6,158,449 A | 12/2000 | Kamikawa | |
| 6,164,297 A | 12/2000 | Kamikawa | |
| 6,375,758 B1 | 4/2002 | Nakashima et al. | |
| 6,575,178 B1 | 6/2003 | Kamikawa | |
| 7,108,752 B2 * | 9/2006 | Kuroda ........................ | 118/712 |
| 2001/0049204 A1 | 12/2001 | Kuroda | |
| 2002/0037207 A1 * | 3/2002 | Yamasaki et al. ............. | 414/222 |
| 2003/0164179 A1 * | 9/2003 | Kamikawa et al. .......... | 134/25.4 |
| 2004/0187342 A1 * | 9/2004 | Izuta ............................... | 34/467 |
| 2006/0137721 A1 | 6/2006 | Kuroda | |
| 2006/0137726 A1 | 6/2006 | Sano et al. | |

(Continued)

FOREIGN PATENT DOCUMENTS

JP 11-163089 6/1999

(Continued)

OTHER PUBLICATIONS

Korean Office Action (Decision to Grant) issued Aug. 3, 2010 in connection with corresponding Korean Patent Application No. 10-2008-0018770.

*Primary Examiner* — Frankie L Stinson
(74) *Attorney, Agent, or Firm* — Ostrolenk Faber LLP

(57) ABSTRACT

A substrate treatment apparatus includes a container holder which holds a container for containing multiple substrates vertically stacked in horizontal postures, a substrate treatment section which collectively applies treatment to multiple substrates horizontally stacked in vertical postures, a main conveyance mechanism which conveys multiple substrates horizontally stacked in vertical postures between a substrate delivery position and the substrate treatment section, a carrying in/out mechanism which carries in/out the multiple substrates with respect to the container and changes postures of the multiple substrates between the horizontal postures and the vertical postures, and a sub conveyance mechanism which receives and delivers multiple substrates in vertical postures from and to the carrying in/out mechanism at a transfer position, receives and delivers multiple substrates in vertical postures from and to the main conveyance mechanism at the substrate delivery position, and conveys multiple substrates in vertical postures between the transfer and substrate delivery positions.

16 Claims, 26 Drawing Sheets

U.S. PATENT DOCUMENTS

2009/0010748 A1  1/2009  Kamikawa et al.

FOREIGN PATENT DOCUMENTS

| JP | 11-165863 | 6/1999 |
| JP | 11-354604 | 12/1999 |
| JP | 3248129 | 11/2001 |
| JP | 2002-64075 | 2/2002 |
| JP | 2002-76094 | 3/2002 |
| JP | 2006-179757 | 7/2006 |
| JP | 2007-123592 | 5/2007 |
| KR | 10-2003-0080355 | 10/2003 |
| KR | 10-2004-0008331 | 1/2004 |

* cited by examiner

SUBSTRATE TREATMENT APPARATUS

BACKGROUND OF THE INVENTION

1. Field of the Invention

The present invention relates to a substrate treatment apparatus which applies treatment to multiple substrates collectively. Substrates to be subjected to treatment include, for example, semiconductor wafers, liquid crystal display device substrates, plasma display substrates, FED (Field Emission Display) substrates, optical disk substrates, magnetic disk substrates, magneto-optical disk substrates, and photo mask substrates.

2. Description of Related Art

A substrate treatment apparatus which applies treatment using a chemical to substrates such as semiconductor wafers includes a batch type which applies treatment to multiple substrates collectively. An example of the batch type substrate treatment apparatus is shown in Japanese Unexamined Patent Publication No. H11-354604. This substrate treatment apparatus includes a carrier mounting section, a horizontal transfer robot, a posture changing mechanism, a pusher, a conveyance mechanism, and a substrate treatment section.

The carrier mounting section is formed so that a carrier (container) which holds multiple substrates stacked vertically in the horizontal postures is mounted thereon.

The horizontal transfer robot made of a multijoint arm type conveyance robot, and is configured so that a multijoint arm is bent and stretched and swiveled around a vertical axis. Accordingly, the horizontal transfer robot turns the multijoint arm to the carrier and places the vertically stacked multiple substrates in the horizontal postures in and out of the carrier, and further turns the multijoint arm to the posture changing mechanism and receives and delivers the vertically stacked multiple substrates in the horizontal postures from and to the posture changing mechanism.

The posture changing mechanism is for changing the postures of the multiple stacked substrates between the horizontal postures and the vertical postures collectively. To prevent substrate displacement during the substrate conveyance with the multijoint arm, the posture changing mechanism is provided with a substrate alignment mechanism.

The pusher includes a holder vertically and horizontally movable, and can collectively receive and deliver multiple substrates in the vertical postures from and to the posture changing mechanism, and can collectively receive and deliver multiple substrates in the vertical postures from and to the conveyance mechanism. The holder can hold the substrates at a half the pitches of the multiple substrates held by the posture changing mechanism. For example, after 25 substrates are delivered to the holder from the posture changing mechanism, the holder is moved by a minute distance in the horizontal direction along the substrate stacking direction. In this state, another 25 substrates are delivered to the holder from the posture changing mechanism. The 25 substrates delivered later enter among the 25 substrates delivered earlier, and a batch of a total of 50 substrates is formed on the holder. Thus, formation of a batch by combining a plurality of substrate groups is referred to as batch assembly. To deliver the substrates from the pusher to the posture changing mechanism, 25 substrates of the 50 substrates held by the holder are delivered to the posture changing mechanism. After the 25 substrates are changed in posture into the horizontal postures, these are delivered to the horizontal transfer robot. Thereafter, the remaining 25 substrates on the holder are delivered to the posture changing mechanism and changed in posture into the horizontal postures, and then discharged by the horizontal transfer robot. Thus, the 50 substrates are separated into two substrate groups each having 25 substrates. This separation of the multiple substrates forming a batch into a plurality of substrate groups is referred to as batch disassembly.

The conveyance mechanism has substrate chucks which hold multiple substrates forming a batch in the vertical posture, and carries the multiple substrates in and out of the substrate treatment section by moving the substrate chucks horizontally. To clean the substrate chuck, a chuck cleaning unit is provided for example, below a substrate delivery position between the pusher and the conveyance mechanism.

The substrate treatment section has a plurality of treatment tanks arranged along the movement direction of the conveyance mechanism. The treatment tanks include a chemical tank, a wash tank, and a dry tank. In the chemical tank, the multiple substrates in the vertical postures are collectively immersed in a chemical stored in the tank and subjected to a chemical treatment. In the wash tank, the multiple substrates in the vertical postures are collectively immersed in pure water (deionized water) stored in the tank and subjected to washing (rinsing). In the dry tank, treatments such as supply of an organic solvent (for example, isopropyl alcohol) or drainage of liquid components are applied to the multiple substrates collectively.

Major problems in the substrate treatment apparatus of the prior art described above are, first, a low substrate treatment speed (throughput), and second, the expense.

In detail, the horizontal transfer robot is a multijoint arm type, so that its mechanical strength constraint can not increase its moving speed in the state that the robot collectively holds multiple substrates. In addition, the multijoint arm type robot itself is expensive. Further, a space for swiveling the multijoint arm is necessary, so that the area occupied substantially by the apparatus is large.

In addition, when the multijoint arm swivels horizontally, the relative positions of the multiple substrates are displaced. Therefore, as described above, the posture changing mechanism needs to have a substrate alignment mechanism. The operation time of this substrate alignment mechanism strains the substrate treatment speed. In addition to the substrate alignment mechanism, the posture changing mechanism must be provided with a horizontal substrate guide for holding substrates in the horizontal postures, a vertical substrate guide for holding substrates in the vertical postures, and a pivotal mechanism for changing the postures of the substrates, which is an extremely expensive robot.

Further, the pusher includes a vertical movement mechanism, a horizontal movement mechanism, and a rotation mechanism, and is also expensive.

Thus, the time required to convey the substrates between the carrier (container) and the conveyance mechanism contributes to hamper improvement in throughput. The construction for substrate conveyance between the carrier (container) and the conveyance mechanism is expensive, which hampers cost reduction of the substrate treatment apparatus.

In the substrate treatment apparatus of the prior art described above, the substrate conveyance path from the carrier to the conveyance mechanism is one system. Therefore, when untreated substrates are sent into the main conveyance mechanism, treated substrates cannot be discharged from the conveyance mechanism to the carrier, and when treated substrates are discharged, untreated substrates cannot be sent. In addition, when untreated substrates are sent into the conveyance mechanism, a batch assembly operation on the holder of the pusher is necessary, so that the waiting time until discharge of the treated substrates is long. Similarly, when treated substrates are discharged, a batch disassembly operation on the holder of the pusher is necessary, so that the waiting time until reaching the state that untreated substrates can be sent in is also long. This contributes to another cause for lowering in substrate treatment speed.

Further, when the untreated substrates are held by the pusher at a substrate delivery position, the conveyance mechanism cannot discharge treated substrates completely treated in the dry tank to the substrate delivery position. Therefore, first, the conveyance mechanism receives untreated substrates at a substrate delivery position to carry in the chemical tank. Thereafter, the conveyance mechanism cleans the substrate chucks by the chuck cleaning unit, and then receives the treated substrates from the dry tank to deriver to the pusher at the substrate delivery position. Foreign bodies on the surface of the untreated substrates are transferred onto the substrate chucks holding the untreated substrates. Therefore, to prevent the foreign bodies from being transferred onto the treated substrates, the substrate chucks must be cleaned before holding the treated substrates. This contributes to still another cause for lowering in substrate treatment speed.

SUMMARY OF THE INVENTION

An object of the present invention is to provide a substrate treatment apparatus that can increase substrate treatment speed.

Another object of the present invention is to provide a substrate treatment apparatus that can reduce cost.

A substrate treatment apparatus according to a first aspect of the invention includes a container holder which holds a container for containing multiple substrates vertically stacked in horizontal postures, a substrate treatment section which collectively applies treatment to multiple substrates horizontally stacked in vertical postures, a main conveyance mechanism which collectively conveys multiple substrates horizontally stacked in vertical postures between a predetermined substrate delivery position and the substrate treatment section, a carrying in/out mechanism which collectively carries in/out the multiple substrates with respect to the container held by the container holder and collectively changes postures of the multiple substrates between the horizontal postures and the vertical postures, and a sub conveyance mechanism which collectively receives and delivers multiple substrates in vertical postures from and to the carrying in/out mechanism at a predetermined transfer position, collectively receives and delivers multiple substrates in vertical postures from and to the main conveyance mechanism at the substrate delivery position, and collectively conveys multiple substrates in vertical postures between the transfer position and the substrate delivery position.

With this construction, the multiple substrates contained in the horizontal postures in the container are carried out collectively by the carrying in/out mechanism, and further changed in posture into the vertical postures by the carrying in/out mechanism. The multiple substrates in the vertical postures are transferred onto the sub conveyance mechanism at the transfer position, conveyed to the substrate delivery position, and delivered to the main conveyance mechanism at the substrate delivery position. The main conveyance mechanism conveys the multiple substrates in the vertical postures to the substrate treatment section. The substrates after being treated in the substrate treatment section are conveyed from the substrate treatment section to the substrate delivery position by the main conveyance mechanism and delivered to the sub conveyance mechanism. The sub conveyance mechanism conveys the substrates from the substrate delivery position to the transfer position and delivers to the carrying in/out mechanism. The carrying in/out mechanism changes the postures of the substrates from the vertical postures into the horizontal postures and then carries in the container.

Thus, in this invention, the substrates are carried in and out of the container and changed in posture in the carrying in/out mechanism. Therefore, the construction can be simplified in comparison with the conventional technique in which substrates are carried in/out using a multijoint arm type robot and an exclusive posture changing mechanism is further used for changing the postures of the substrates.

Further, the carrying in/out mechanism is required to perform only the operations for carrying the substrates in and out of the container and the posture changing operation, so that horizontal swiveling of the multijoint arm of the conventional technique is not necessary. Therefore, the operation time can be shortened. Accordingly, the time required for substrate conveyance can be shortened, and the number of substrates capable of being treated per unit time can be improved. That is, the substrate treatment speed can be increased.

It is preferable that the carrying in/out mechanism includes a multiple-substrate holding hand which collectively holds multiple substrates, a hand advancing and retreating mechanism which advances and retreats the multiple-substrate holding hand along a predetermined advancing and retreating direction along the horizontal direction with respect to the container held by the container holder, and a hand swiveling mechanism which swivels the multiple-substrate holding hand by at least 90 degrees along a vertical plane along the advancing and retreating direction.

With this construction, by advancing and retreating the multiple-substrate holding hand with respect to the container, the carrying in/out mechanism collectively carries the multiple substrates out of the container, and by swiveling the multiple-substrate holding hand by 90 degrees along the vertical plane along the advancing and retreating direction, the carrying in/out mechanism can change the substrate postures from the horizontal postures into the vertical postures. When the substrates are carried in the container, the multiple-substrate holding hand is advanced to or retreated from the container after changing of the postures from the vertical postures into the horizontal postures. Thus, the substrates can be changed in posture by the hand swiveling operation within the vertical plane including the advancing and retreating direction of the multiple-substrate holding hand, so that the construction of the carrying in/out mechanism can be simplified. As a matter of course, horizontal swiveling of the multijoint arm of the conventional technique is not necessary. Therefore, the multiple-substrate holding hand can be advanced or retreated and changed rapidly in posture with respect to the container.

The multiple-substrate holding hand may include a plurality of hand elements each of which holds one substrate, and each hand element may have a first substrate holder on one side of a hand element alignment direction, and a second substrate holder on the other side of the hand element alignment direction. In this case, it is preferable that the carrying in/out mechanism further includes a hand rotation mechanism which rotates the multiple-substrate holding hand around a predetermined rotation axis so as to reverse the surface and the back of the hand element.

With this construction, by rotating the multiple-substrate holding hand by the hand rotation mechanism, either the first substrate holder or the second substrate holder can be set as an upper side. Thus, the first substrate holder and the second substrate holder can be switched and used for substrate holding. Therefore, for example, one substrate holder is used for holding an untreated substrate, and the other substrate holder is used for holding a treated substrate. Accordingly, transfer of foreign bodies on the surface of an untreated substrate onto a treated substrate can be reduced or prevented.

It is preferable that the carrying in/out mechanism further includes a support guide which supports multiple substrates in vertical postures from below. With this construction, the substrates in the vertical postures can be supported by the support guide. Along with this, when the multiple-substrate holding hand are turned into the vertical posture, the multiple substrates can be aligned simultaneously by the support guide. Accordingly, multiple substrates can be aligned by an inexpensive construction. In addition, substrate posture change and substrate alignment can be completed simultaneously, so that the time necessary for substrate conveyance between the container and the main conveyance mechanism can be further shortened.

It is preferable that the support guide has a pair of substrate holding grooves with respect to each hand element. In this case, it is preferable that the carrying in/out mechanism further includes a guide drive mechanism which selects either one of the pair of substrate holding grooves for holding substrates by driving the support guide. With this construction, either one of the pair of the substrate holding grooves can be selected by the guide drive mechanism, so that one of the pair of substrate holding grooves can be used for holding an untreated substrate and the other can be used for holding a treated substrate. Accordingly, transfer of foreign bodies on the surface of the untreated substrate onto the treated substrate can be reduced or prevented.

The sub conveyance mechanism may include a transfer mechanism which has a transfer support for collectively holding multiple substrates horizontally stacked in vertical postures, and vertically moves this transfer support to collectively receive and deliver multiple substrates in vertical postures from and to the carrying in/out mechanism at the transfer position, and a horizontal conveyance mechanism which has a horizontal conveyance holder which aligns and holds multiple substrates in vertical postures in the horizontal direction, and collectively receives and delivers multiple substrates in vertical postures between the transfer support and the horizontal conveyance holder at the transfer position, collectively receives and delivers the multiple substrates in the vertical postures between the main conveyance mechanism and the horizontal conveyance holder at the substrate delivery position, and horizontally moves the horizontal conveyance holder between the transfer position and the substrate delivery position.

With this construction, by vertically moving the transfer support of the transfer mechanism, the substrates can be received from and delivered to the carrying in/out mechanism and received from and delivered to the horizontal conveyance mechanism. Therefore, by mediating by the simply-constructed transfer mechanism, the substrates can be delivered between the carrying in/out mechanism and the horizontal conveyance mechanism. The horizontal conveyance mechanism conveys horizontally the substrates between the transfer position and the substrate delivery position, so that it is prevented from being complicated in construction. Thus, the cost of the sub conveyance mechanism can also be reduced.

It is preferable that the transfer mechanism is disposed on the opposite side of the carrying in/out mechanism with respect to the advancing and retreating direction of the multiple-substrate holding hand.

With this construction, the carrying in/out mechanism can carry the substrates in and out of the container by advancing and retreating the multiple-substrate holding hand, and access the transfer position by movement along the advancing and retreating direction. Accordingly, the construction of the carrying in/out mechanism can be further simplified and the cost can be reduced.

The horizontal conveyance mechanism may be constructed so as to access the transfer position from the horizontal direction orthogonal to the advancing and retreating direction of the multiple-substrate holding hand. That is, the horizontal conveyance mechanism may move the horizontal conveyance holder in the horizontal direction orthogonal to the advancing and retreating direction of the multiple-substrate holding hand. With this construction, the substrate conveyance direction can be changed between the direction of accessing the container and the conveyance direction to the substrate delivery position via a transfer operation of the transfer mechanism at the transfer position. Accordingly, the construction can be further simplified. In addition, the substrate conveyance speed can be made much faster than that of the conventional technique in which the substrate conveyance direction is changed by swiveling the multijoint arm, so that the substrate treatment speed can be further increased.

It is preferable that the transfer mechanism further includes a support horizontal movement mechanism which moves the transfer support in a predetermined distance range along the horizontal direction (for example, hand advancing and retreating direction) in which the substrates in the vertical postures are stacked. With this construction, after the first substrate group is transferred from the transfer support to the horizontal conveyance holder, the second substrate group is received by the transfer support from the carrying in/out mechanism, and this second substrate group can be transferred to a position deviating from the first substrate group of the horizontal conveyance holder. Accordingly, the first and second substrates can be held by the horizontal conveyance holder, and a batch made of the first and second substrate groups can be assembled.

For example, after the first substrate group is transferred onto the horizontal conveyance holder, the transfer support may be moved horizontally by a half distance (half pitch) of the substrate holding pitch of the first substrate group and the second substrate group may be transferred onto the horizontal conveyance holder. Accordingly, the first substrate group and the second substrate group are held on the horizontal conveyance holder in a state that the substrates of the respective groups alternately overlap each other. Accordingly, the horizontal conveyance holder can hold many substrates in a small space. The substrate treatment section which treats the batch in this state can treat many substrates in a small space.

It is preferable that the transfer support includes a pair of support guide shafts which hold multiple substrates horizontally stacked in vertical postures from both sides, and preferably, the support guide shaft has, at circumferentially different positions, a contact portion which comes into contact with the substrates and a retract portion for securing a predetermined distance between the pair of support guide shafts so as to allow the substrates to pass through between the pair of support guide shafts, and preferably, the transfer mechanism further includes a guide pivotal mechanism which pivots the pair of support guide shafts around respective axes. It is preferable that this substrate treatment apparatus further includes a control unit which switches between a substrate supporting state that the contact portions of the pair of support guide shafts are opposed to each other and a substrate passing state that the retract portions of the pair of support guide shafts are opposed to each other by controlling the guide pivotal mechanism.

With this construction, due to a substrate supporting state that the contact portions of the pair of support guide shafts are opposed to each other, multiple substrates in the vertical postures can be received from the carrying in/out mechanism or the horizontal conveyance mechanism and supported. On the other hand, when substrates are not supported, due to the substrate passing state that the retract portions are opposed to each other, interference with substrates held by the carrying in/out mechanism or the horizontal conveyance mechanism can be avoided and the pair of support guide shafts can be moved vertically. Accordingly, for example, after substrates are delivered to the horizontal conveyance mechanism, the pair of support guide shafts can be retracted to predetermined retracted positions (for example, positions at which they do not obstruct horizontal movement of the horizontal conveyance holder), and a construction for this is simple.

It is preferable that the contact portion includes a first contact portion and a second contact portion arranged at circumferentially different positions of the support guide shaft. With this construction, either the first contact portion or the second contact portion can be selected and used for supporting the substrates, so that, for example, the first and second contact portions can be switched between supporting of untreated substrates and supporting of treated substrates. Accordingly, transfer of foreign bodies on the surface of an untreated substrate onto a treated substrate can be reduced or prevented.

It is preferable that the horizontal conveyance mechanism further includes a horizontal rotation mechanism which rotates the horizontal conveyance holder in a range of at least 90 degrees around a vertical axis (preferably, horizontal rotation around the center of gravity of the horizontal conveyance holder).

The main conveyance mechanism includes, for example, a substrate collective holding means which collectively holds multiple substrates in vertical postures horizontally stacked perpendicular to the hand advancing and retreating direction of the carrying in/out mechanism and a traversing means which moves the substrate collective holding means in a traverse direction parallel to the hand advancing and retreating direction. In this case, the substrate treatment section includes, for example, a plurality of treatment units aligned in the traverse direction.

In this case, by rotation of the horizontal conveyance holder by 90 degrees around a vertical axis in the horizontal conveyance mechanism, the stacking direction of the multiple substrates can be converted between the stacking direction in the transfer mechanism and the stacking direction in the main conveyance mechanism. The substrate stacking direction is converted by horizontal swiveling of the multijoint arm in the conventional technique, and such arm horizontal swiveling is time-consuming. On the other hand, according to the present invention, the horizontal conveyance holder is rotated, so that this rotation can be completed quickly, and the construction for this is simple. Accordingly, the substrate conveyance speed can be increased and the substrate treatment apparatus cost can be reduced.

It is preferable that the horizontal rotation mechanism rotates the horizontal conveyance holder in a range of at least 180 degrees around a vertical axis (preferably, rotates horizontally around the center of gravity of the horizontal conveyance holder). With this construction, the substrates in the vertical postures held on the horizontal conveyance holder can be horizontally rotated by 180 degrees. Accordingly, for example, at the time of batch assembly described above, device forming surfaces (surfaces formed with devices thereon) of the substrates constituting the first substrate group and the substrates constituting the second substrate group can be opposed to each other, and non-device forming surfaces (surfaces formed without devices thereon) can be opposed to each other. Accordingly, for example, when the batch is immersed in a treatment liquid, problems such as re-adhesion of foreign bodies to the device forming surfaces from the non-device forming surfaces of adjacent substrates can be reduced or prevented.

It is preferable that the horizontal conveyance holder has a plurality of substrate holding grooves formed at half pitches of substrate holding pitches of the transfer support. With this construction, the horizontal conveyance holder can hold many substrates in a small space, and a batch can be assembled on this horizontal conveyance holder.

It is preferable that the horizontal conveyance holder includes a first guide which supports multiple substrates horizontally stacked in vertical postures, and a second guide which supports multiple substrates horizontally stacked in the vertical postures, and the horizontal conveyance mechanism includes a guide elevating mechanism which elevates the first guide relative to the second guide. With this construction, by elevation of the first guide relative to the second guide, substrates can be held by either the first guide or the second guide. Therefore, by selective use of the first and second guides for untreated substrates and treated substrates, transfer of foreign bodies on the surfaces of untreated substrates onto treated substrates can be reduced or prevented.

It is preferable that the main conveyance mechanism collectively conveys multiple substrates between a predetermined first substrate delivery position and a second substrate delivery position and the substrate treatment section, and the sub conveyance mechanism includes a transfer mechanism which has a transfer support which collectively holds multiple substrates and collectively receives and delivers multiple substrates between the transfer support and the carrying in/out mechanism at the transfer position, a first substrate movement mechanism which has a first conveyance holder for holding multiple substrates, collectively receives and delivers multiple substrates between the transfer support and the first conveyance holder at the transfer position, collectively receives and delivers multiple substrates between the main conveyance mechanism and the first conveyance holder at the first substrate delivery position, and moves the first conveyance holder between the transfer position and the first substrate delivery position, and a second substrate movement mechanism which has a second conveyance holder for holding multiple substrates, collectively receives and delivers multiple substrates between the transfer support and the second conveyance holder at the transfer position, collectively receives and delivers multiple substrates between the main conveyance mechanism and the second conveyance holder at the second substrate delivery position, and moves the second conveyance holder between the transfer position and the second substrate delivery position.

The first conveyance support may be a first horizontal conveyance holder for aligning horizontally and holding multiple substrates in the vertical postures. The first substrate movement mechanism can collectively deliver multiple substrates in the vertical postures between the transfer support and the first horizontal conveyance holder at the transfer position, collectively receive and deliver multiple substrates in the vertical posture between the main conveyance mechanism and the first horizontal conveyance holder at the first substrate delivery position, and horizontally move the first horizontal conveyance holder between the transfer position and the first substrate delivery position. The second conveyance support may be a second horizontal conveyance holder for aligning horizontally and holding multiple substrates in the vertical postures. In this case, the second substrate movement mechanism may be a second horizontal conveyance mechanism which can collectively receive and deliver multiple substrates in the vertical postures between the transfer support and the second horizontal conveyance holder at the transfer position, collectively receive and deliver multiple substrates in the vertical postures between the main conveyance mechanism and the second horizontal conveyance holder at the second substrate delivery position, and horizontally move the second horizontal conveyance holder between the transfer position and the second substrate delivery position.

With this construction, the main conveyance mechanism can deliver and receive substrates by accessing the first and second substrate delivery positions. Then, substrate conveyance between the first substrate delivery position and the transfer mechanism is performed by the first substrate movement mechanism, substrate conveyance between the second substrate delivery position and the transfer position is performed by the second substrate movement mechanism. Thus, two substrate conveyance paths can be provided between the transfer mechanism and the main conveyance mechanism, so that even when one substrate conveyance path is used for taking untreated substrates out of the container and sending to the main conveyance mechanism by the carrying in/out mechanism, treated substrates can be discharged from the main conveyance mechanism to the transfer mechanism via the other substrate conveyance path. Therefore, waiting time can be reduced, so that the substrate treatment speed can be increased.

It is preferable that the first substrate movement mechanism receives substrates after being treated by the substrate treatment section from the main conveyance mechanism at the first substrate delivery position and delivers these to the transfer mechanism at the transfer position, and the second substrate movement mechanism receives substrates before being treated by the substrate treatment section from the transfer mechanism at the transfer position and delivers these to the main conveyance mechanism at the second substrate delivery position.

With this construction, the main conveyance mechanism operates to receive untreated substrates from the second substrate movement mechanism at the second substrate delivery position and conveys to the substrate treatment section and discharge treated substrates to the first substrate movement mechanism at the first substrate delivery position. By separation of the paths for carrying-in of untreated substrates and discharge of treated substrates, the waiting time can be shortened and the substrate treatment speed can be increased in comparison with the conventional technique in which a substrate conveyance path is commonly used for substrate carrying-in and substrate discharge.

The main conveyance mechanism may include a substrate chuck which collectively hold multiple substrates. In this case, it is preferable that the substrate treatment apparatus further includes a chuck cleaning unit for cleaning the substrate chuck of the main conveyance mechanism, and a conveyance control unit which controls operation of the main conveyance mechanism so that substrates after being treated by the substrate treatment section are conveyed to the first substrate delivery position (preferably, without cleaning the substrate chucks by the chuck cleaning unit), and then the substrates are conveyed from the second substrate delivery position to the substrate treatment section, and thereafter, the substrate chuck is cleaned by the chuck cleaning unit.

With this construction, even in a situation that untreated substrates are waiting at the second substrate delivery position, the main conveyance mechanism can discharge treated substrates from the substrate treatment section to the first substrate delivery position first, and then convey the untreated substrates at the second substrate delivery position to the substrate treatment section. That is, the main conveyance mechanism need not bring the substrate chuck into contact with the untreated substrates before carrying out treated substrates, so that it is not necessary to clean the substrate chuck before discharging of the treated substrates. Therefore, cleaning times of the substrate chuck can be reduced. Further, the substrate chuck is cleaned during spare time after discharging of treated substrates and carrying of untreated substrates in the substrate treatment section, so that the substrate treatment speed can be further increased.

It is preferable that the substrate treatment apparatus further includes a transfer control unit which performs the steps of controlling the carrying in/out mechanism, the transfer mechanism, and the first substrate movement mechanism so that a first substrate group as a part of multiple substrates held by the first conveyance holder is delivered to the transfer support and the first substrate group is delivered from this transfer support to the carrying in/out mechanism, and thereafter, a second substrate group as another part (for example, residue) of the multiple substrates held by the first conveyance holder is delivered to the transfer support and the second substrate group is delivered from this transfer support to the carrying in/out mechanism, and controlling the carrying in/out mechanism, the transfer mechanism, and the second substrate movement mechanism so that a third substrate group is delivered from the carrying in/out mechanism to the transfer support and the third substrate group is delivered from the transfer support to the second conveyance holder, and thereafter, a fourth substrate group is delivered from the carrying in/out mechanism to the transfer support and this fourth substrate group is further delivered from the transfer support to the second conveyance holder and the third substrate group and the fourth substrate group are held on the second conveyance holder.

With this construction, multiple substrates held by the first conveyance holder are divided into a first substrate group and a second substrate group and transferred onto the transfer support, whereby a batch disassembly operation is performed. A third substrate group is transferred from the transfer support onto the second conveyance holder and then a fourth substrate group is transferred from the transfer support onto the second conveyance holder, whereby a batch assembly operation is performed. Thus, a batch disassembly operation is performed on the first substrate movement mechanism (first conveyance holder) side, and a batch assembly operation is performed on the second substrate movement mechanism (second conveyance holder) side. Therefore, even during the batch disassembly operation, the operation of delivering a plurality of untreated substrates for forming a batch from the second substrate movement mechanism to the main conveyance mechanism can be performed. Even during the batch assembly operation, the operation of delivering treated substrates from the main conveyance mechanism to the first substrate movement mechanism can be performed. Accordingly, the waiting time during the batch disassembly operation or batch assembly operation can be shortened, so that the substrate treatment speed can be further increased.

It is preferable that the substrate treatment apparatus further includes a mediating mechanism which mediates reception and delivery of substrates between the second conveyance holder and the main conveyance mechanism at the second substrate delivery position.

With this construction, substrates can be received and delivered between the second horizontal conveyance mechanism and the main conveyance mechanism via the mediating mechanism, so that the actual working time of the second horizontal conveyance mechanism or the main conveyance mechanism for substrate delivery can be shortened. Accordingly, the substrate treatment speed can be further increased. Further, it is also possible to deliver substrates to another unit arranged at the second substrate delivery position by the mediating mechanism. An example of this unit is a substrate orientation alignment mechanism which aligns the orientations of the substrates (for example, crystalline orientations of semiconductor wafers).

It is preferable that the transfer support of the transfer mechanism collectively holds multiple substrates horizontally stacked in vertical postures, and the transfer mechanism collectively receives and delivers multiple substrates in vertical postures between the transfer support and the carrying in/out mechanism at the transfer position, the first conveyance holder is for horizontally aligning and holding multiple substrates in vertical postures, the first substrate movement mechanism collectively receives and delivers multiple substrates in vertical postures between the transfer support and the first conveyance holder at the transfer position and collectively receives and delivers multiple substrates in vertical postures between the main conveyance mechanism and the first conveyance holder at the first substrate delivery position, and the second conveyance holder is for horizontally aligning and holding multiple substrates in vertical postures, and the second substrate movement mechanism collectively receives and delivers multiple substrates in vertical postures between the transfer support and the second conveyance holder at the transfer position and collectively receives and delivers multiple substrates in vertical postures between the main conveyance mechanism and the second conveyance holder at the second substrate delivery position.

A substrate treatment apparatus according to a second aspect of the invention includes a container holder which holds a container for containing multiple substrates, a substrate treatment section which collectively applies treatment to multiple substrates, a main conveyance mechanism which collectively conveys multiple substrates between a predetermined first substrate delivery position and a second substrate delivery position, and the substrate treatment section, a carrying in/out mechanism which collectively carries multiple substrates in and out of a container held by the container holder, a transfer mechanism which has a transfer support for collectively holding multiple substrates and collectively receives and delivers multiple substrates between the transfer support and the carrying in/out mechanism at a predetermined transfer position, a first substrate movement mechanism which has a first conveyance holder for holding multiple substrates, and collectively receives and delivers multiple substrates between the transfer support and the first conveyance holder at the transfer position, collectively receives and delivers multiple substrates between the main conveyance mechanism and the first conveyance holder at the first substrate delivery position, and moves the first conveyance holder between the transfer position and the first substrate delivery position, and a second substrate movement mechanism which has a second conveyance holder for holding multiple substrates, collectively receives and delivers multiple substrates between the transfer support and the second conveyance holder at the transfer position, collectively receives and delivers multiple substrates between the main conveyance mechanism and the second conveyance holder at the second substrate delivery position, and moves the second conveyance holder between the transfer position and the second substrate delivery position.

With this construction, the main conveyance mechanism can deliver and receive substrates by accessing the first and second substrate delivery positions. Substrate conveyance between the first substrate delivery position and the transfer mechanism is performed by the first substrate movement mechanism, and substrate conveyance between the second substrate delivery position and the transfer position is performed by the second substrate movement mechanism. Thus, two substrate conveyance paths can be provided between the transfer mechanism and the main conveyance mechanism, so that even when one substrate conveyance path is used for taking untreated substrates out of the container and sending into the main conveyance mechanism by the carrying in/out mechanism, treated substrates can be discharged from the main conveyance mechanism to the transfer mechanism via the other substrate conveyance path. Therefore, the waiting time can be reduced, so that the substrate treatment speed can be increased.

It is preferable that the first substrate movement mechanism receives substrates after being treated by the substrate treatment section from the main conveyance mechanism at the first substrate delivery position and delivers these to the transfer mechanism at the transfer position, and the second substrate movement mechanism receives substrates before being treated by the substrate treatment section from the transfer mechanism at the transfer position and delivers these to the main conveyance mechanism at the second substrate delivery position.

With this construction, the main conveyance mechanism operates so as to receive untreated substrates from the second substrate movement mechanism at the second substrate delivery position and convey to the substrate treatment section, and discharge treated substrates to the first substrate movement mechanism at the first substrate delivery position. By separation of the paths for carrying-in untreated substrates and discharging treated substrates, the waiting time can be shortened and the substrate treatment speed can be increased in comparison with the conventional technique in which a substrate conveyance path is commonly used for substrate carrying-in and substrate discharge.

It is preferable that the main conveyance mechanism includes a substrate chuck which collectively holds multiple substrates. In this case, it is preferable that the substrate treatment apparatus further includes a chuck cleaning unit for cleaning the substrate chuck of the main conveyance mechanism, and a conveyance control unit which controls operation of the main conveyance mechanism so that after substrates after being treated by the substrate treatment section are conveyed to the first substrate delivery position, the substrates are conveyed from the second substrate delivery position to the substrate treatment section (preferably, without cleaning the substrate chuck by the chuck cleaning unit), and thereafter, the substrate chuck is cleaned by the chuck cleaning unit.

With this construction, even in a situation that untreated substrates wait at the second substrate delivery position, the main conveyance mechanism can discharge treated substrates from the substrate treatment section to the first substrate delivery position first, and then convey the untreated substrates at the second substrate delivery position to the substrate treatment section. In other words, the main conveyance mechanism need not bring the substrate chuck into contact with untreated substrates before carrying out treated substrates, so that it is not necessary to clean the substrate chuck before discharging of the treated substrates. Therefore, cleaning times of the substrate chuck can be reduced. Further, the substrate chuck can be cleaned during spare time after discharging of treated substrates and carrying of untreated substrates in the substrate treatment section, so that the substrate treatment speed can be further increased.

It is preferable that the substrate treatment apparatus further includes a transfer control unit which performs the steps of controlling the carrying in/out mechanism, the transfer mechanism, and the first substrate movement mechanism so that a first substrate group as a part of multiple substrates held by the first conveyance holder is delivered to the transfer support, the first substrate group is delivered from the transfer support to the carrying in/out mechanism, and then a second substrate group as another part (for example, residue) of the multiple substrates held by the first conveyance holder is delivered to the transfer support, and the second substrate group is delivered from the transfer support to the carrying in/out mechanism, and controlling the carrying in/out mechanism, the transfer mechanism, and the second substrate movement mechanism so that a third substrate group is delivered from the carrying in/out mechanism to the transfer support, the third substrate group is delivered from the transfer support to the second conveyance holder, and then a fourth substrate group is delivered from the carrying in/out mechanism to the transfer support, the fourth substrate group is further delivered from the transfer support to the second conveyance holder, and the third substrate group and the fourth substrate group are held on the second conveyance holder.

With this construction, multiple substrates held by the first conveyance holder are divided into a first substrate group and a second substrate group and transferred onto the transfer support, whereby a batch disassembly operation is performed. A third substrate group is transferred from the transfer support onto the second conveyance holder and then a fourth substrate group is transferred from the transfer support onto the second conveyance holder, whereby a batch assembly operation is performed. Thus, a batch disassembly operation is performed on the first substrate movement mechanism (first conveyance holder) side and a batch assembly operation is performed on the second substrate movement mechanism (second conveyance holder) side. Therefore, even during a batch disassembly operation, the operation of delivering a plurality of untreated substrates for forming a batch from the second substrate movement mechanism to the main conveyance mechanism can be performed. Even during a batch assembly operation, the operation of delivering treated substrates from the main conveyance mechanism to the first substrate movement mechanism can be performed. Thus, the waiting time during the batch disassembly operation or batch assembly operation can be shortened, so that the substrate treatment speed can be further increased.

It is preferable that the substrate treatment apparatus further includes a mediating mechanism which mediates reception and delivery of substrates between the second conveyance holder and the main conveyance mechanism at the second substrate delivery position.

With this construction, substrate delivery between the second substrate movement mechanism and the main conveyance mechanism can be performed via the mediating mechanism, so that actual working time of the second substrate movement mechanism or the main conveyance mechanism for substrate delivery can be shortened. Accordingly, the substrate treatment speed can be further increased. Further, it is also possible to deliver substrates to another unit arranged at the second substrate delivery position by the mediating mechanism. An example of this unit is a substrate orientation alignment mechanism which aligns orientations of substrates (for example, crystalline orientations of semiconductor wafers).

The container holder may be for holding a container for containing multiple substrates vertically stacked in the horizontal postures, the substrate treatment section may collectively apply treatment to multiple substrates horizontally stacked in the vertical postures, the main conveyance mechanism may collectively convey multiple substrates horizontally stacked in the vertical postures, the carrying in/out mechanism may collectively carry multiple substrates in and out of the container held by the container holder and collectively change the postures of the multiple substrates between the horizontal postures and the vertical postures, the transfer support of the transfer mechanism may collectively hold multiple substrates horizontally stacked in the vertical postures, the transfer mechanism may collectively deliver multiple substrates in the vertical postures between the transfer support and the carrying in/out mechanism, the first conveyance holder may be for aligning horizontally and holding multiple substrates in the vertical postures, the first substrate movement mechanism may collectively receive and deliver multiple substrates in the vertical postures between the transfer support and the first conveyance holder at the transfer position and collectively receive and deliver multiple substrates in the vertical postures between the main conveyance mechanism and the first conveyance holder at the first substrate delivery position, the second conveyance holder may be for aligning horizontally and holding multiple substrates in the vertical postures, the second substrate movement mechanism may collectively receive and deliver multiple substrates in the vertical postures between the transfer support and the second conveyance holder at the transfer position and collectively receive and deliver multiple substrates in the vertical postures between the main conveyance mechanism and the second conveyance holder at the second substrate delivery position.

With this construction, multiple substrates contained in the horizontal postures in the container are collectively carried out by the carrying in/out mechanism, and further changed in posture into the vertical postures by the carrying in/out mechanism. The multiple substrates in the vertical postures are transferred onto the first or second conveyance holder at the transfer position, conveyed to the first or second substrate delivery position, and delivered to the main conveyance mechanism at the first or second substrate delivery position. The main conveyance mechanism conveys the multiple substrates in the vertical postures to the substrate treatment section. Substrates after being treated by the substrate treatment section are conveyed from the substrate treatment section to the first or second substrate delivery position by the main conveyance mechanism, and delivered to the first or second substrate movement mechanism. The first or second substrate movement mechanism conveys the substrates from the first or second substrate delivery position to the transfer position, and delivers to the transfer mechanism. Further, the transfer mechanism delivers the substrates to the carrying in/out mechanism. The carrying in/out mechanism changes the postures of the substrates from the vertical postures into the horizontal postures, and carries in the container.

Thus, in the carrying in/out mechanism, substrates are carried in/out of the container and changed in posture. Therefore, the construction can be simplified in comparison with the conventional technique in which substrates are carried in/out using a multijoint arm type robot and an exclusive posture changing mechanism is further used for changing the postures of the substrates.

Further, the carrying in/out mechanism is required to perform the operation of carrying substrates in/out of the container and the posture changing operation, so that horizontal swiveling of the multijoint arm of the conventional technique is not necessary. Therefore, the operation time can be shortened. Accordingly, the time required for substrate conveyance can be shortened, and the number of substrates treatable per unit time can be increased. That is, the substrate treatment speed can be increased.

By vertical movement of the transfer support of the transfer mechanism, substrates can be received from and delivered to the carrying in/out mechanism and substrates can be received from and delivered to the first and second substrate movement mechanisms. Therefore, via the simply-constructed transfer mechanism, substrates can be delivered between the carrying in/out mechanism and the first and second substrate movement mechanisms.

The above-described or other objects, features, and effects of the present invention will be apparent from the following description of embodiments with reference to the accompanying drawings.

DETAILED DESCRIPTION OF THE PREFERRED EMBODIMENTS

[Entire Construction of First Embodiment]

Figure 1:
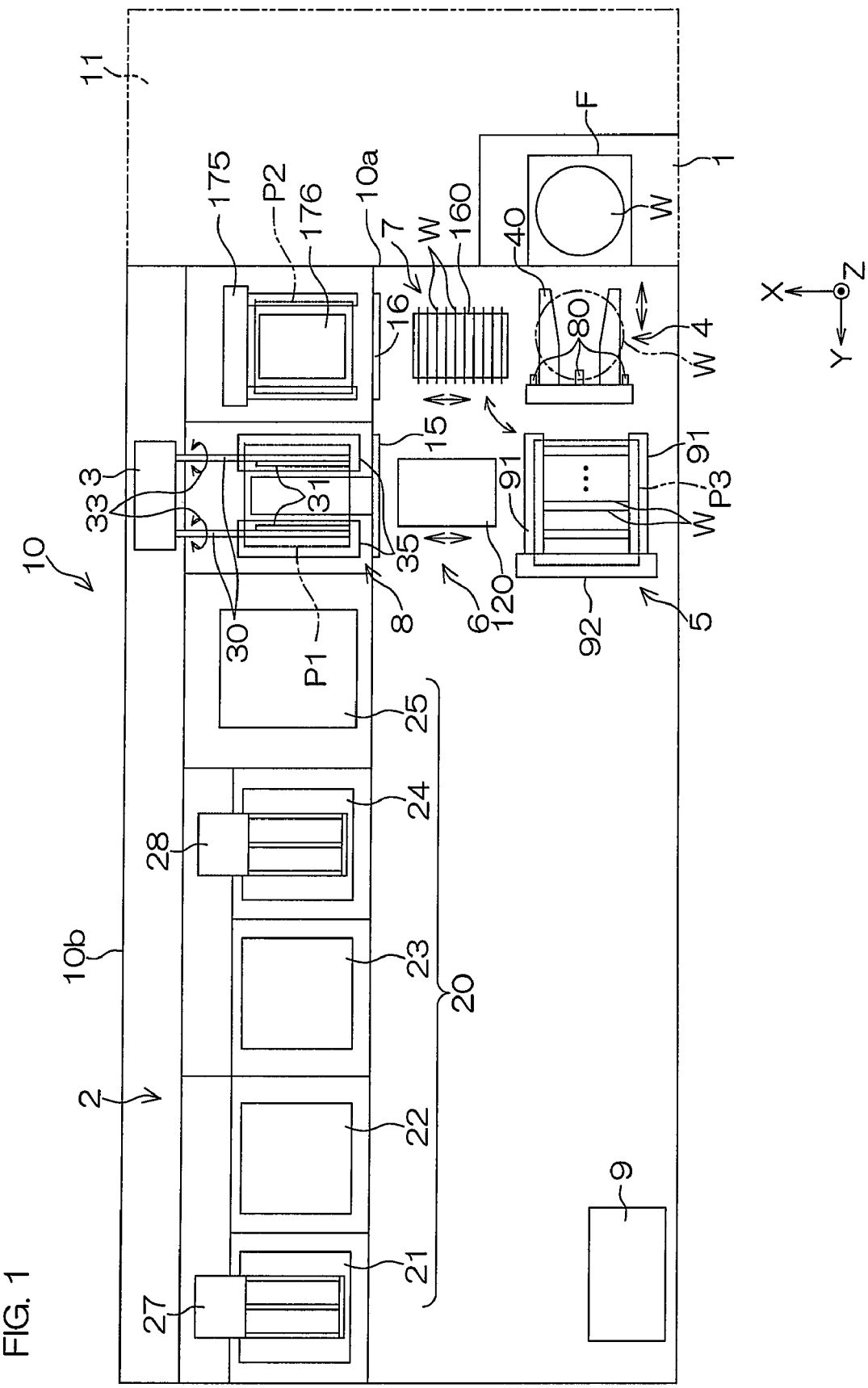
FIG. 1 is a schematic plan view for describing an entire construction of a substrate treatment apparatus of an embodiment of the present invention.

FIG. 1 is a schematic plan view for describing an entire construction of a substrate treatment apparatus of an embodiment of the present invention. This substrate treatment apparatus 10 includes a FOUP holder 1, a substrate treatment section 2, a main conveyance mechanism 3, a carrying in/out mechanism 4, a transfer mechanism 5, a first horizontal conveyance mechanism 6, a second horizontal conveyance mechanism 7, a chuck cleaning unit 8, and a controller 9 (control unit).

The FOUP holder 1 is disposed at one corner of the substrate treatment apparatus 10 shaped into substantially a rectangle in a plan view. This FOUP holder 1 is a container holder which can hold a FOUP F as a container for containing multiple substrates W in the horizontal postures stacked in a Z direction (vertical direction, perpendicular direction). An automatic FOUP conveyance device 11 shown by the alternate long and two short dashed line is disposed so as to face the front face 10a (corresponding to one shorter side in a plan view) of the substrate treatment apparatus 10. The automatic FOUP conveyance device 11 has functions of supplying a FOUP F containing untreated substrates W to the FOUP holder 1, supplying a FOUP F (empty FOUP) in which treated substrates W are to be contained to the FOUP holder 1, and retracting a FOUP F held by the FOUP holder 1 so as to replace the FOUP to be held by the FOUP holder 1. Substrates W are circular substrates like semiconductor wafers in this embodiment.

The substrate treatment section 2 includes a plurality of treatment units 20 arranged along the Y direction (horizontal direction) along the side surface (corresponding to one longer side in a plan view) 10b of the substrate treatment apparatus 10. The plurality of treatment units 20 include a first chemical tank 21, a first rinse solution tank 22, a second chemical tank 23, a second rinse solution tank 24, and a drying unit 25. The first chemical tank 21 and the second chemical tank 23 store the same kind or different kinds of chemicals, and multiple substrates W are collectively immersed in the chemical and subjected to chemical treatment. The first rinse solution tank 22 and the second rinse solution tank 24 store a rinse solution (for example, pure water), and multiple (for example, 50) substrates W are immersed in the rinse solution and their surfaces are subjected to rinse treatment.

In this embodiment, the first chemical tank 21 and the first rinse solution tank 22 adjacent thereto are paired, and the second chemical tank 23 and the second rinse solution tank 24 adjacent thereto are paired. There are provided a first lifter 27 as an exclusive conveyance mechanism for conveying substrates W subjected to chemical treatment in the first chemical tank 21 to the first rinse solution tank 22 and a second lifter 28 as an exclusive conveyance mechanism for conveying substrates W subjected to chemical treatment in the second chemical tank 23 to the second rinse solution tank 24. The first and second lifters 27 and 28 include a substrate support which supports multiple (for example, 50) substrates W in the vertical postures stacked along the X direction (horizontal direction), an elevating drive mechanism which vertically moves the substrate support, and a traverse drive mechanism which traverses the substrate support along the Y direction. The X direction is the horizontal direction along the front face 10a of the substrate treatment apparatus 10 and orthogonal to the Y direction.

With this construction, the first lifter 27 collectively receives multiple substrates W stacked in the X direction in the vertical postures from the main conveyance mechanism 3, and lowers the multiple substrates W in the first chemical tank 21 to immerse in the chemical. Further, after waiting for a predetermined chemical treatment time, the first lifter 27 lifts the substrate support to raise the multiple substrates W from the chemical, traverses the substrate support to the first rinse solution tank 22, and further, lowers the substrate support into the first rinse solution tank 22 to immerse in the rinse solution. After waiting for a predetermined rinse treatment time, the first lifter 27 lifts the substrate support to raise the substrates W from the rinse solution. Thereafter, the multiple substrates W are collectively delivered from the first lifter 27 to the main conveyance mechanism 3. Similarly, the second lifter 28 also collectively receives multiple substrates W stacked in the X direction in the vertical postures from the main conveyance mechanism 3, and lowers the multiple substrates W into the second chemical tank 23 to immerse in the chemical. Further, after waiting for a predetermined chemical treatment time, the second lifter 28 lifts the substrate support to raise the multiple substrates W from the chemical, traverses the substrate support to the second rinse solution tank 24, and further, lowers the substrate support into the second rinse solution tank 24 to immerse in the rinse solution. After waiting a predetermined rinse treatment time, the second lifter 28 lifts the substrate support to raise the substrates W from the rinse solution. Thereafter, the multiple substrates W are collectively delivered from the second lifter 28 to the main conveyance mechanism 3.

The drying unit 25 has a substrate holding mechanism which holds multiple (for example, 50) substrates W stacked in the X direction in the vertical postures and supplies an organic solvent (isopropyl alcohol or the like) to the substrates W in a decompressed atmosphere and drains liquid components off the surfaces of the substrates W by centrifugal force to dry the substrates w. This drying unit 25 can receive and deliver the substrates W from and to the main conveyance mechanism 3.

The main conveyance mechanism 3 includes a pair of substrate chucks (sandwiching mechanism) 30 as a substrate collectively holding means capable of collectively holding multiple (for example, 50) substrates W in the vertical postures stacked in the X direction, a chuck drive mechanism which actuates the substrate chucks 30, a traverse drive mechanism which horizontally moves (traverses) the substrate chucks 30 along the Y direction, and an elevating drive mechanism for elevating the substrate chucks 30 along the Z direction. The pair of substrate chucks 30 include a pair of shaft-like support guides 31 extending in the X direction, and a plurality of substrate supporting grooves for receiving the multiple substrates W in the vertical postures and supporting from below are formed at axial intervals on the sides facing each other of the support guides 31. The chuck drive mechanism scales the distance between the pair of support guides 31 by pivoting the pair of substrate chucks 30 in the direction of the arrow 33. Accordingly, the substrate chucks 30 can perform open and close operations for switching between a holding state to sandwich and hold the substrates W and a release state to release sandwiching of the substrate W. By the open and close operations and the vertical movements of the first and second lifters 27 and 28, the substrates W can be received and delivered between the first and second lifters 27 and 28 and the substrate chucks 30. Further, the main conveyance mechanism 3 can collectively receive and deliver multiple substrates W stacked in the X direction in the vertical postures from and to the drying unit 25.

The main conveyance mechanism 3 receives a plurality of untreated substrates W stacked in the X direction in the vertical postures at a first substrate delivery position P1, and discharges a plurality of treated substrates W stacked in the X direction in the vertical postures at a second substrate delivery position P2.

The chuck cleaning unit 8 is disposed below the first substrate delivery position P1. The chuck cleaning unit 8 has a pair of cleaning tanks 35 into which a pair of substrate chucks 30 are separately inserted. In the pair of cleaning tanks 35, the substrate chucks 30 (particularly, the substrate guides 31) are cleaned using a cleaning liquid. The main conveyance mechanism 3 lowers the substrate chucks 30 to insert into the cleaning tanks 35 of the chuck cleaning unit 8 at the first substrate delivery position P1 before conveying the treated substrates W dried in the drying unit 25. Then, after cleaning of the substrate chucks 30 in the cleaning tanks 35, the main conveyance mechanism 3 operates to collectively receive the treated substrates W from the drying unit 25.

A shutter 15 is provided on the transfer mechanism 5 side of the first substrate delivery position P1, and a shutter 16 is provided on the carrying in/out mechanism 4 side of the second substrate delivery position P2. The shutter 15 is opened when the first horizontal conveyance mechanism 6 accesses the first substrate delivery position P1, and is maintained in a closed state in other periods. The shutter 16 is opened when the second horizontal conveyance mechanism 7 accesses the second substrate delivery position P2, and is maintained in a closed state in other periods. Accordingly, leak of the chemical on the substrate treatment section 2 side is reduced or prevented.

[Construction for Substrate Conveyance]

Figure 2:
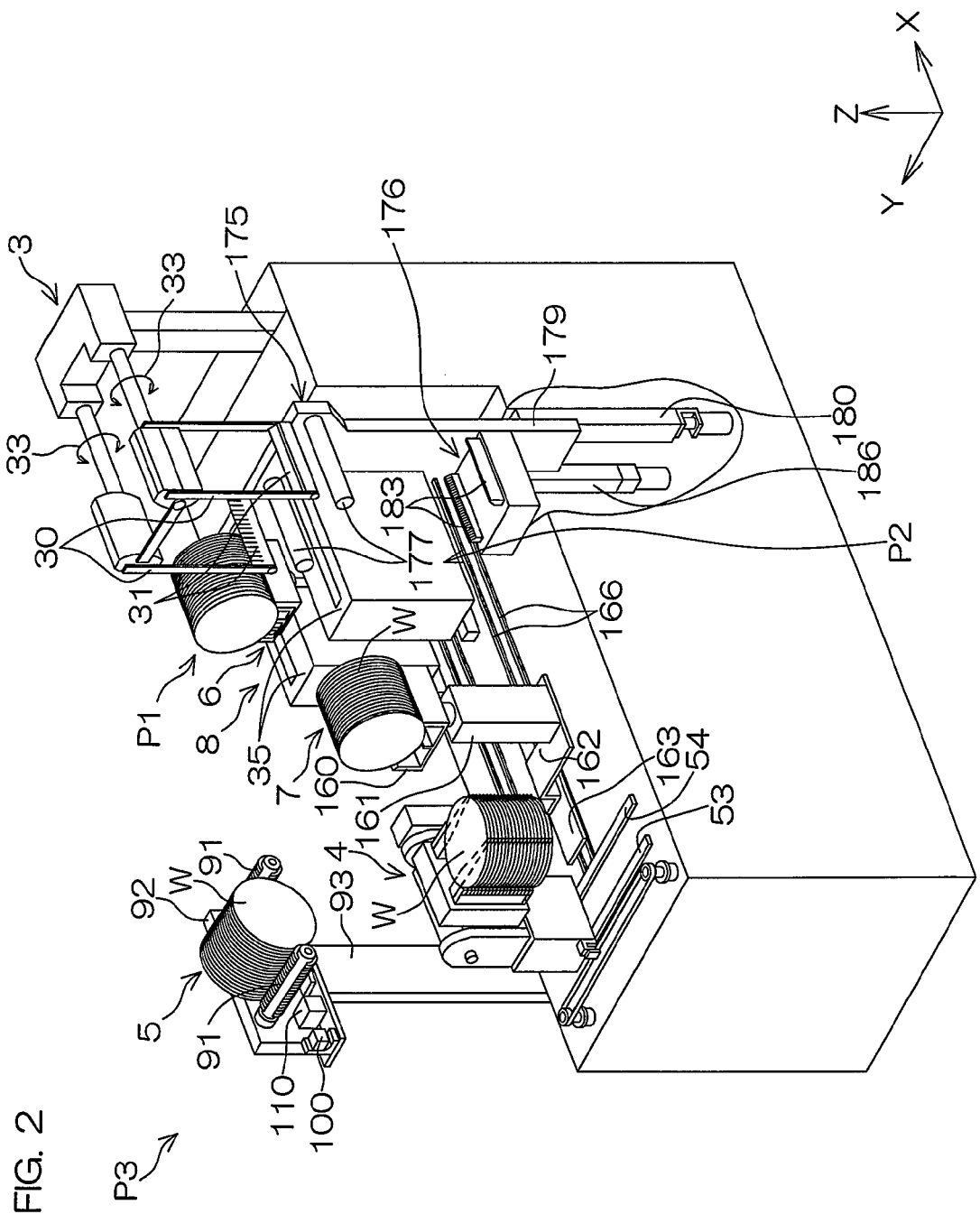
FIG. 2 is a perspective view in an enlarged manner of a construction relating to substrate conveyance between a FOUP and a main conveyance mechanism.

FIG. 2 is a perspective view in an enlarged manner of a construction relating to substrate conveyance between the FOUP F and the main conveyance mechanism 3. Reference is made to both FIG. 2 and FIG. 1 described above.

The second substrate delivery position P2 is set near one corner close to the front face 10a of the substrate treatment apparatus 10, and the carrying in/out mechanism 4 is disposed at the other corner along the front face 10a. For this carrying in/out mechanism 4, the transfer mechanism 5 is disposed on the opposite side of the FOUP holder 1 in the Y direction. The first horizontal conveyance mechanism 6 is disposed between the transfer mechanism 5 and the first substrate delivery position P1. The second horizontal conveyance mechanism 7 is disposed between the carrying in/out mechanism 4 and the second substrate delivery position P2. The transfer mechanism 5 is disposed at a transfer position P3 at which substrates are delivered between the carrying in/out mechanism 4 and the transfer mechanism 5, the transfer mechanism 5 and the first horizontal conveyance mechanism 6, and the transfer mechanism 5 and the second horizontal conveyance mechanism 7.

[Construction of Carrying In/Out Mechanism]

Figure 3:
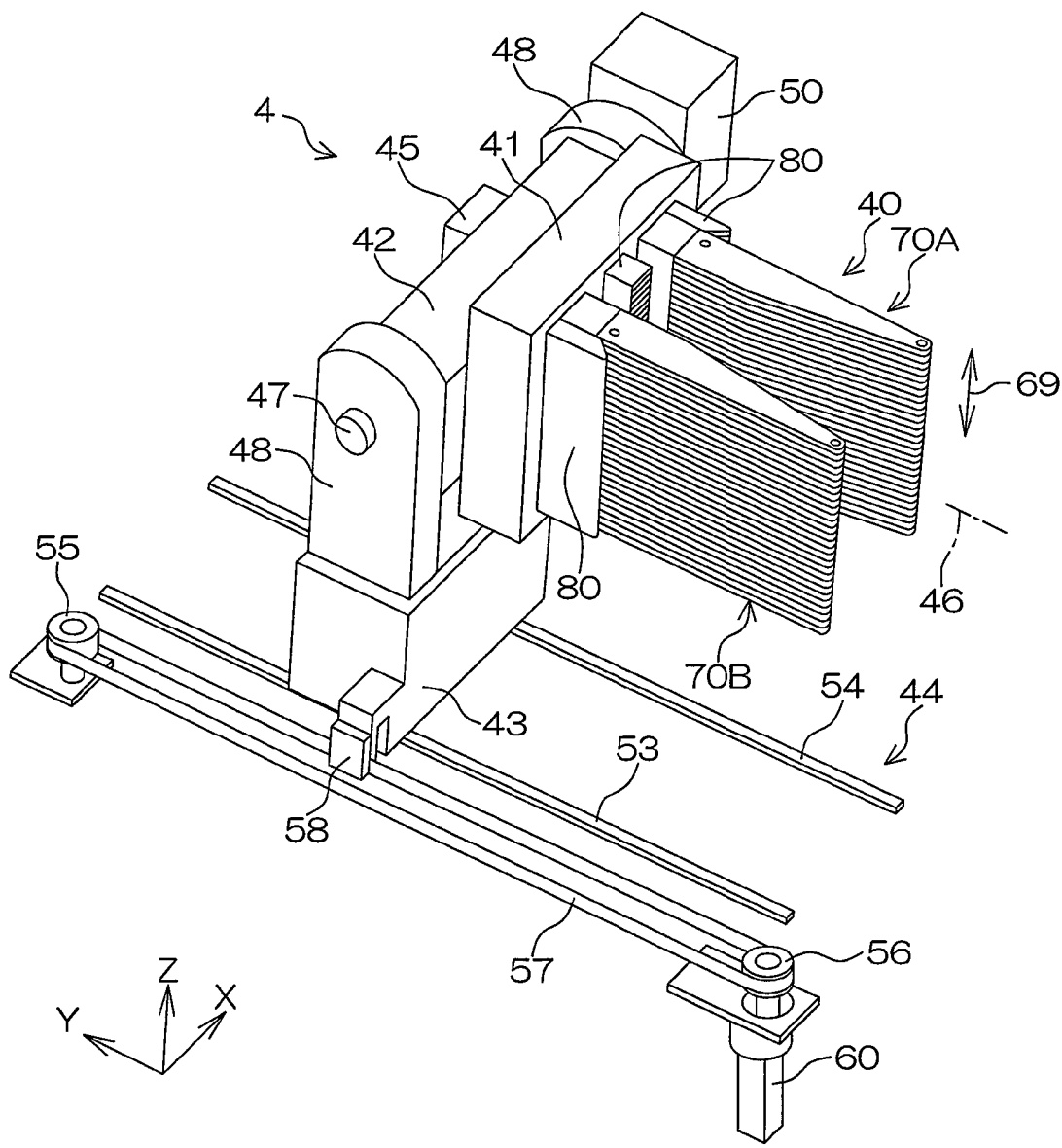
FIG. 3 is a perspective view of a carrying in/out mechanism.
Figure 4:
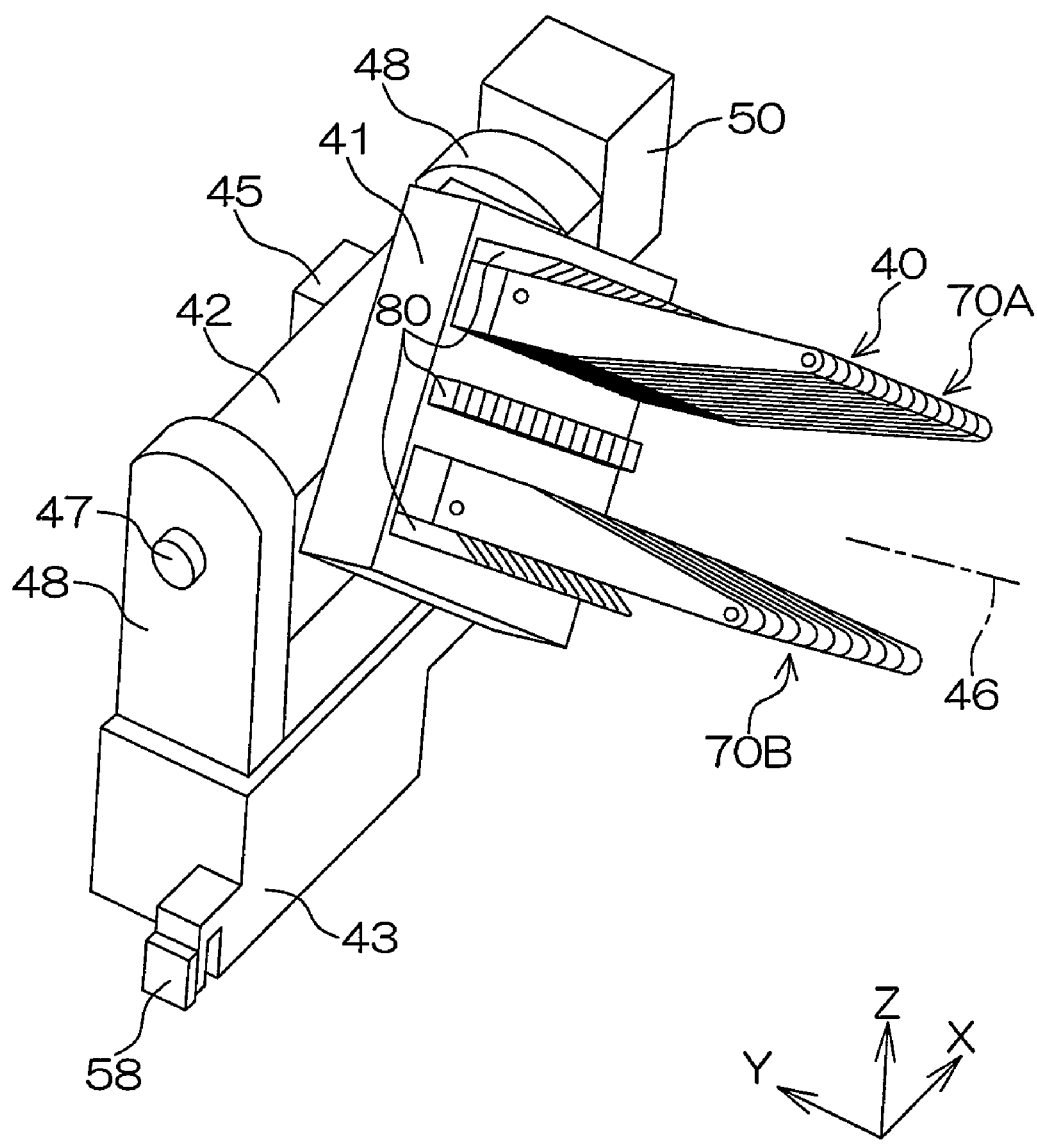
FIG. 4 is a perspective view for describing rotation of a batch hand.

FIG. 3 is a perspective view seen from obliquely above for describing a construction of the carrying in/out mechanism 4. The carrying in/out mechanism 4 includes a batch hand 40 as a multiple-substrate holding hand capable of collectively holding multiple substrates W in a stacked state, a hand support 41 which supports this batch hand 40, a swiveling block 42, an advancing and retreating block 43, and a hand advancing and retreating mechanism 44. A hand rotating motor 45 as a hand rotation mechanism is fixed to the swiveling block 42, and the hand support 41 is connected to the rotation shaft of the hand rotating motor 45. Accordingly, the hand support 41 can rotate relative to the swiveling block 42 in the range of 360 degrees around the central axis 46 of the batch hand 40, and this relative rotation can be generated by driving the hand rotating motor 45. Therefore, as shown in FIG. 4, the batch hand 40 can be rotated around the central axis 46.

The swiveling block 42 is connected to the advancing and retreating block 43 via a shaft 47 along the X direction so as to swivel around this shaft 47. In detail, the advancing and retreating block 43 has a pair of arms 48 extending in the Z direction on both ends of the upper surface facing each other in the X direction. The swiveling block 42 is disposed between the pair of arms 48, and one end in the X direction of the swiveling block 42 is connected to one arm 48 via the shaft 47. The other end in the X direction of the swiveling block 42 is connected to a rotation shaft of a swiveling motor 50 as a hand rotation mechanism. This swiveling motor 50 is fixed to the other arm 48. Therefore, by driving the swiveling motor 50, the swiveling block 42 can be rotated around the shaft 47 within the YZ plane. Accordingly, a hand swiveling mechanism for swiveling the central axis 46 of the batch hand 40 along the YZ plane is constructed. Using this hand swiveling mechanism, the postures of the multiple substrates W can be changed between the horizontal postures and the vertical postures (see FIG. 5).

The hand advancing and retreating mechanism 44 includes a pair of linear guides 53 and 54 which guide the advancing and retreating block 43 so as to move linearly along the Y direction, a driven pulley (toothed pulley) 55 disposed near one end of one linear guide 53, a drive pulley (toothed pulley) 56 disposed near the other end of the linear guide 53, a belt (toothed belt) 57 wound to the pulleys 55 and 56 along the Y direction, a belt retainer 58 which connects the advancing and retreating block 43 to the belt 57, and an advancing and retreating motor 60 whose rotation shaft is connected to the drive pulley 56. With this construction, the advancing and retreating block 43 can be moved horizontally in the Y direction by rounding the belt 57 by driving the advancing and retreating motor 60, and accordingly, the batch hand 40 can be advanced and retreated with respect to the FOUP F held by the FOUP holder 1.

Figure 6:
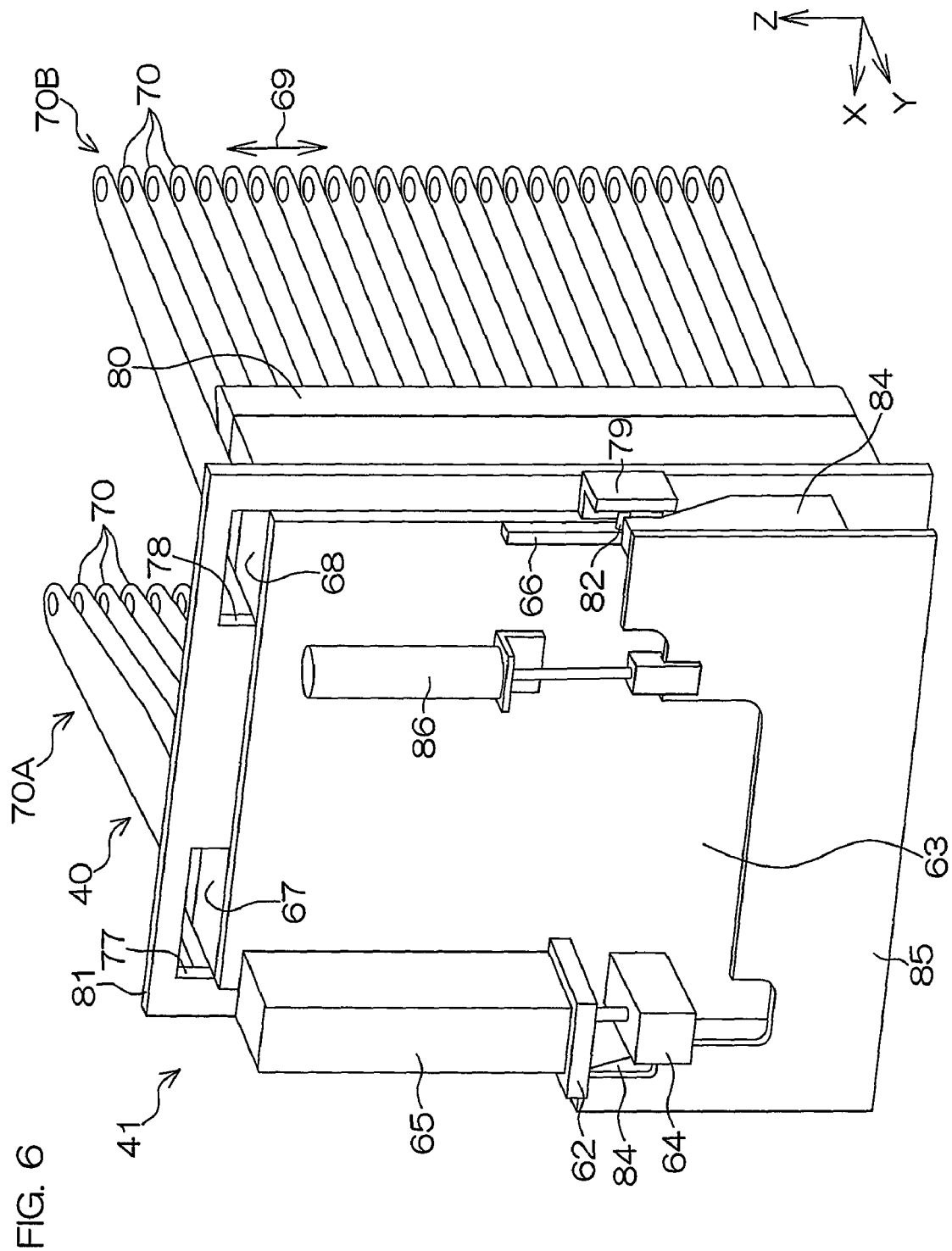
FIG. 6 is a perspective view for describing a construction for moving vertically the batch hand.

FIG. 6 is a perspective view for describing a construction for moving vertically the batch hand 40, and shows a construction inside the hand support 41. The hand support 41 includes a fixed base 62, a movable base 63, and an actuator 65. The batch hand 40 is fixed to the movable base 63. This movable base 63 is connected to a movable block 64, and this movable block 64 is driven by the actuator 65. The movable base 63 is movable relative to the fixed base 62 while being guided along a hand element alignment direction 69 of the batch hand 40 along an unillustrated linear guide. The actuator 65 moves linearly the movable block 64 along the hand element alignment direction 69 using, for example, an electric motor as a drive source. With this construction, the batch hand 40 can be moved along the hand element alignment direction 69 by driving the actuator 65. Using this, multiple substrates W contained in the FOUP F can be scooped up or placed on a plurality of substrate container racks formed inside the FOUP F.

Figure 7:
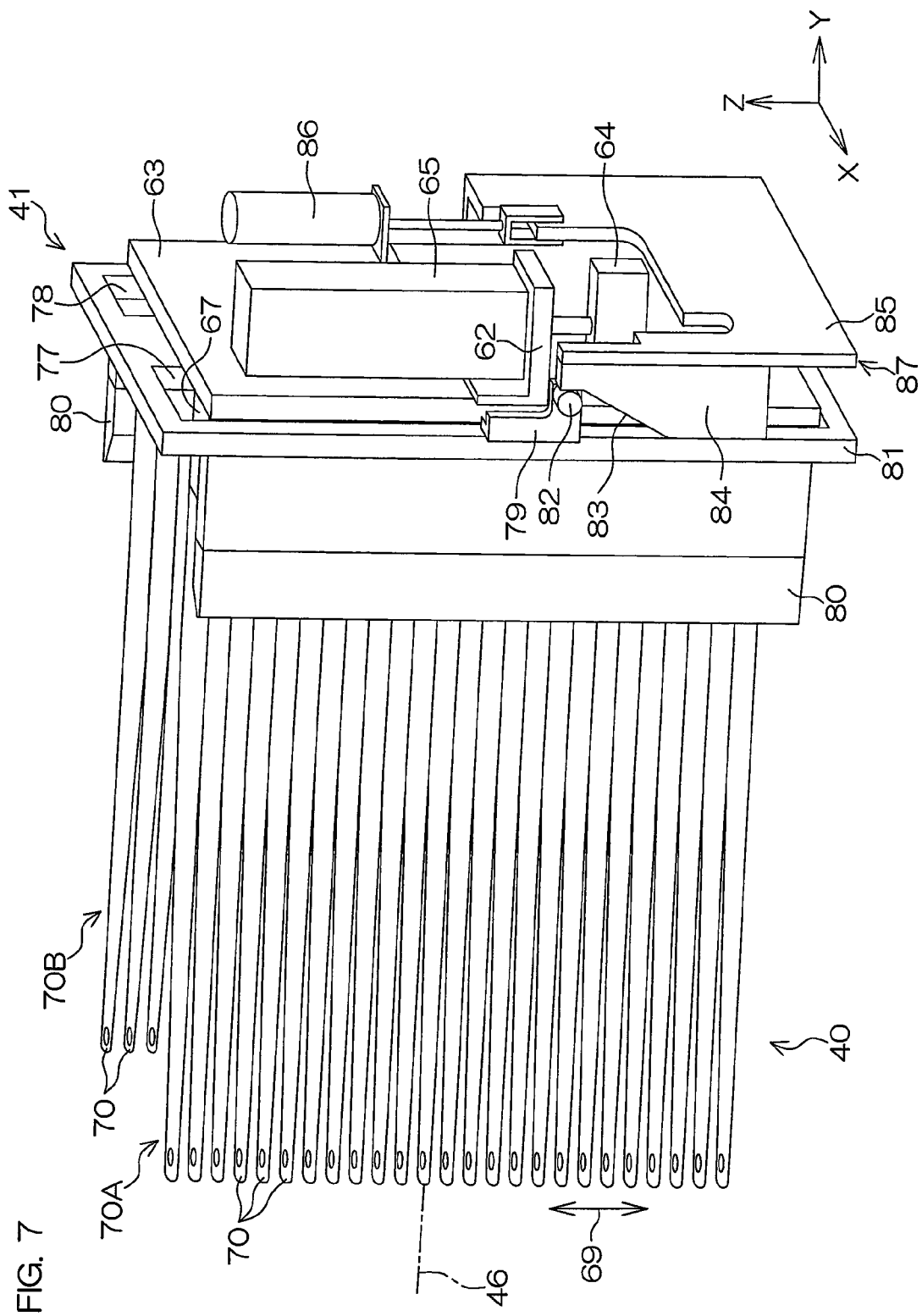
FIG. 7 is a perspective view for describing the batch hand and a construction relating thereto.

FIG. 7 is a perspective view for describing the batch hand 40 and a construction relating thereto. The batch hand 40 includes a plurality of hand elements 70 aligned along the hand element alignment direction 69. Each hand element 70 is a thin-plate beam extending in the normal direction of one surface of the hand support 41, and is formed into substantially a wedge shape in a plan view. In a state that each two of the plurality of hand elements 70 are opposed to each other at a predetermined distance, the hand elements are stacked at intervals in the hand element alignment direction 69 orthogonal to the direction in which the hand elements are opposed to each other. The central axis 46 of the batch hand 40 is defined as an imaginary straight line which passes through the centers of gravity of all hand elements 70 along a direction parallel to the hand elements 70. A pair of hand element rows 70A and 70B made of a plurality of hand elements 70 aligned in the hand element alignment direction 69 are formed across the central axis 46.

One substrate W can be held by two hand elements 70 opposed to each other. Therefore, multiple substrates W can be collectively held while being stacked in the hand element alignment direction 69. In this embodiment, in one FOUP F, 25 substrates W in the horizontal postures can be held in a stacked state in the Z direction. Corresponding thereto, 25 pairs of hand elements 70 are stacked at the same intervals as those of the substrates W inside the FOUP F. Therefore, the batch hand 40 can collectively hold all substrates W inside the FOUP F.

Figure 8:
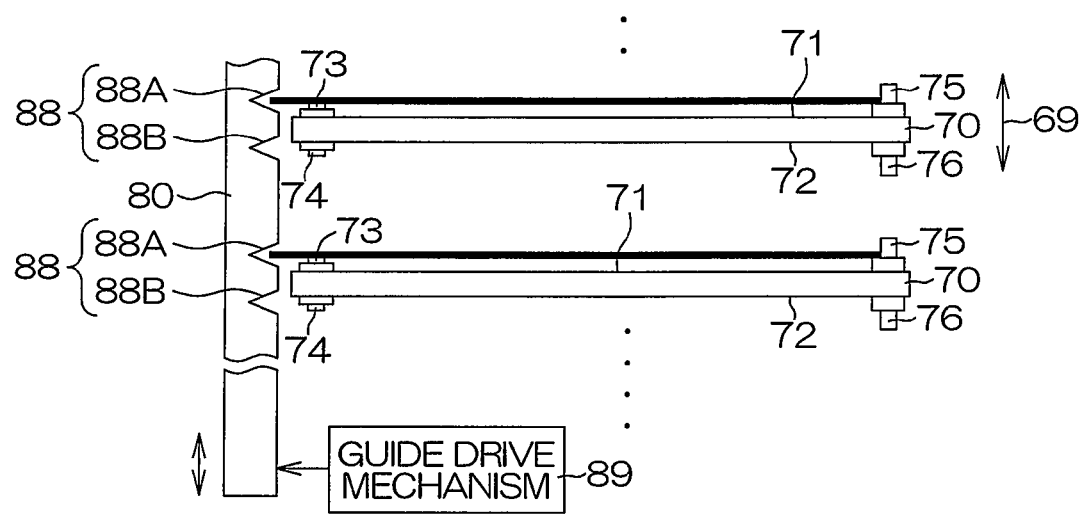
FIG. 8 is a schematic view for describing a construction of a hand element and a support guide.

As schematically shown in FIG. 8, each hand element 70 has a first support surface 71 and a second support surface 72 that are surfaces opposite to each other. At a base end on the hand support 41 side end of the hand element 70, a first support projection 73 is provided on the first support surface 71, and a second support projection 74 is provided on the second support surface 72. At the tip end of the hand element 70, a first guide projection 75 is provided on the first support surface 71, and a second guide projection 76 is provided on the second support surface 72. The first support projection 73 and the first guide projection 75 provided on the first support surface 71 constitute a first substrate holder, and the second support projection 74 and the second guide projection 76 provided on the second support surface 72 constitute a second substrate holder.

With control of the rotation position of the batch hand 40 around the central axis 46, when the first support surface 71 is set upward, the first support projection 73 and the first guide projection 75 can be brought into contact with a substrate W and can support this substrate W. When the second support surface 72 is set upward, the second support projection 74 and the second guide projection 76 can be brought into contact with a substrate W and can support this substrate W. When a substrate W is supported, the support projections 73 and 74 come into contact with the lower surface of the substrate W on the base end side of the hand element 70, and the guide projections 75 and 76 come into contact with the peripheral end face and the lower surface peripheral edge of the substrate W on the tip end side of the hand element 70.

For example, when untreated substrates W should be held by the batch hand 40, the hand rotating motor 45 is controlled such that the first support surfaces 71 come to the upper surfaces, and when treated substrates W should be held by the batch hand 40, the second support surfaces 72 come to the upper surfaces. Accordingly, the support projections 73 and 74 and the guide projections 75 and 76 to come into contact with the substrate W can be switched for untreated substrates W and treated substrate W. As a result, transfer of foreign bodies adhering to the untreated substrates W onto treated substrates W via the batch hand 40 can be reduced or prevented.

Figure 5:
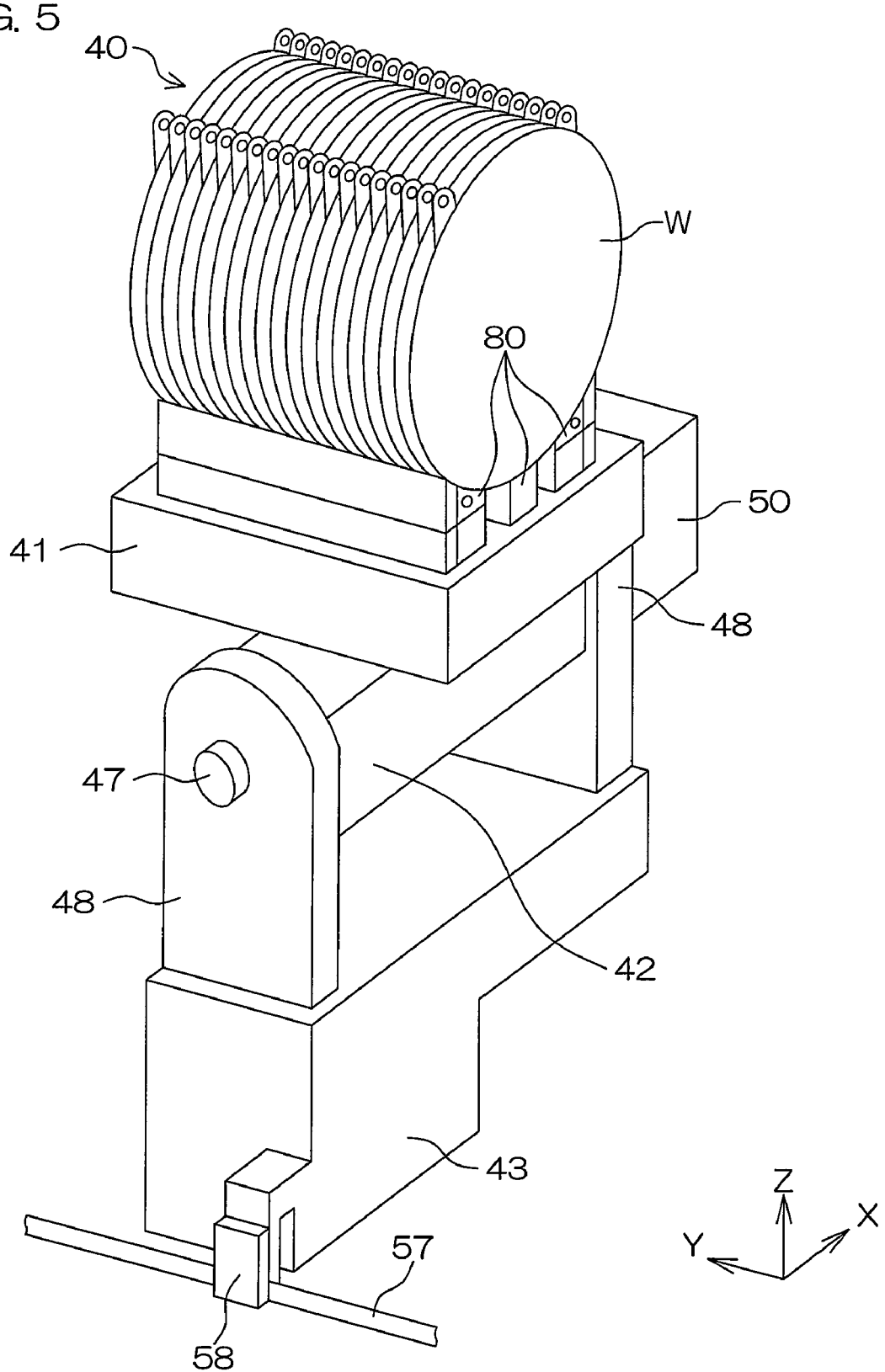
FIG. 5 is a perspective view for describing substrate posture change by the carrying in/out mechanism.

As shown in FIG. 4, FIG. 5, FIG. 7, or the like, the hand support 41 is provided with three shaft-like support guides 80 at positions close to the base ends of the hand elements 70. The three support guides 80 are arranged parallel to the hand element alignment direction 69, and one support guide 80 is disposed outside one hand element row 70A (opposite the batch hand central axis 46), another one support guide 80 is disposed outside the other hand element row 70B, and the remaining one support guide 80 is disposed substantially at an intermediate position between the hand element rows 70A and 70B.

The three support guides 80 are fixed commonly to the front portion of the guide base 81 (see FIG. 7). The guide base 81 is connected to the movable base 63 linearly movably in the direction along the central axis 46 of the batch hand. A bracket 79 substantially in an L shape projecting oppositely to the support guides 80 with respect to the movable base 63 is fixed to the rear portion of the guide base 81. To this bracket 79, a cam follower 82 is attached oppositely to the support guides 80. On the other hand, a cam 84 having a cam surface 83 to come into contact with the cam follower 82 is provided on the movable base 63. The cam 84 is positioned at an opposite side of the support guides 80 with respect to the movable base 63, and has a cam surface 83 on the support guide 80 side. This cam surface 83 includes an inclined surface inclined with respect to the hand element alignment direction 69. The cam 84 is attached to the movable base 63 linearly movably along the hand element alignment direction 69.

The cam 84 is connected to a cam base 85, and this cam base 85 is driven by a cylinder 86. The cylinder 86 is fixed to the movable base 63, and linearly moves the cam base 85 along the hand element alignment direction 69. The linear movement of the cam base 85 is guided by the linear guide 66 (see FIG. 6). According to the linear movement of the cam base 85, the cam follower 82 moves (rolls) on the cam surface 83, whereby the guide base 81 advances or retreats along the batch hand central axis 46. Corresponding thereto, the support guides 80 also advance or retreat along the batch hand central axis 46. Accordingly, the cam 84 and the cylinder 86, or the like, constitute a guide advancing and retreating mechanism 87 for advancing and retreating the support guides 80 with respect to the hand elements 70.

A pair of through holes 77 and 78 are formed around both edges of the guide base 81. These through holes 77 and 78 are rectangular along the hand element alignment direction 69. Hand element support members 67 and 68 are provided so as to penetrate through these through holes 77 and 78. The rear portions of the hand element support members 67 and 68 are fixed to the movable base 63. A plurality of hand elements 70 constituting the hand element rows 70A and 70B are individually fixed to the front portions of the hand element support members 67 and 68.

With advance of the support guides 80 to the tip end side of the batch hand 40 by driving the guide advancing and retreating mechanism 87, the substrates W can be sandwiched between the support guides 80 and the guide projections 75 and 76 from the front and rear sides. This sandwiching state is used when the batch hand 40 is changed in posture between the horizontal postures and the vertical postures. Accordingly, the substrates W can be stably held during posture change, and dropping of the substrates W can be reduced or prevented.

As schematically shown in FIG. 8, each support guide 80 has a plurality of substrate holding grooves 88 which are opened in a direction toward the substrates W supported by the hand elements 70 and formed at intervals in the hand element alignment direction 69. In detail, for each hand element 70, a first substrate holding groove 88A and a second substrate holding groove 88B are formed. A guide drive mechanism 89 is provided which moves the guide base 81 in the axial direction of the support guides 80. With this construction, the first substrate holding groove 88A or the second substrate holding groove 88B can be aligned by controlling the guide drive mechanism 89 with the end face of the substrate W held by the hand elements 70. Accordingly, for example, the first substrate holding groove 8 8A can be used for holding an untreated substrate W and the second substrate holding groove 88B can be used for holding a treated substrate W.

[Construction of Transfer Mechanism]

Figure 9:
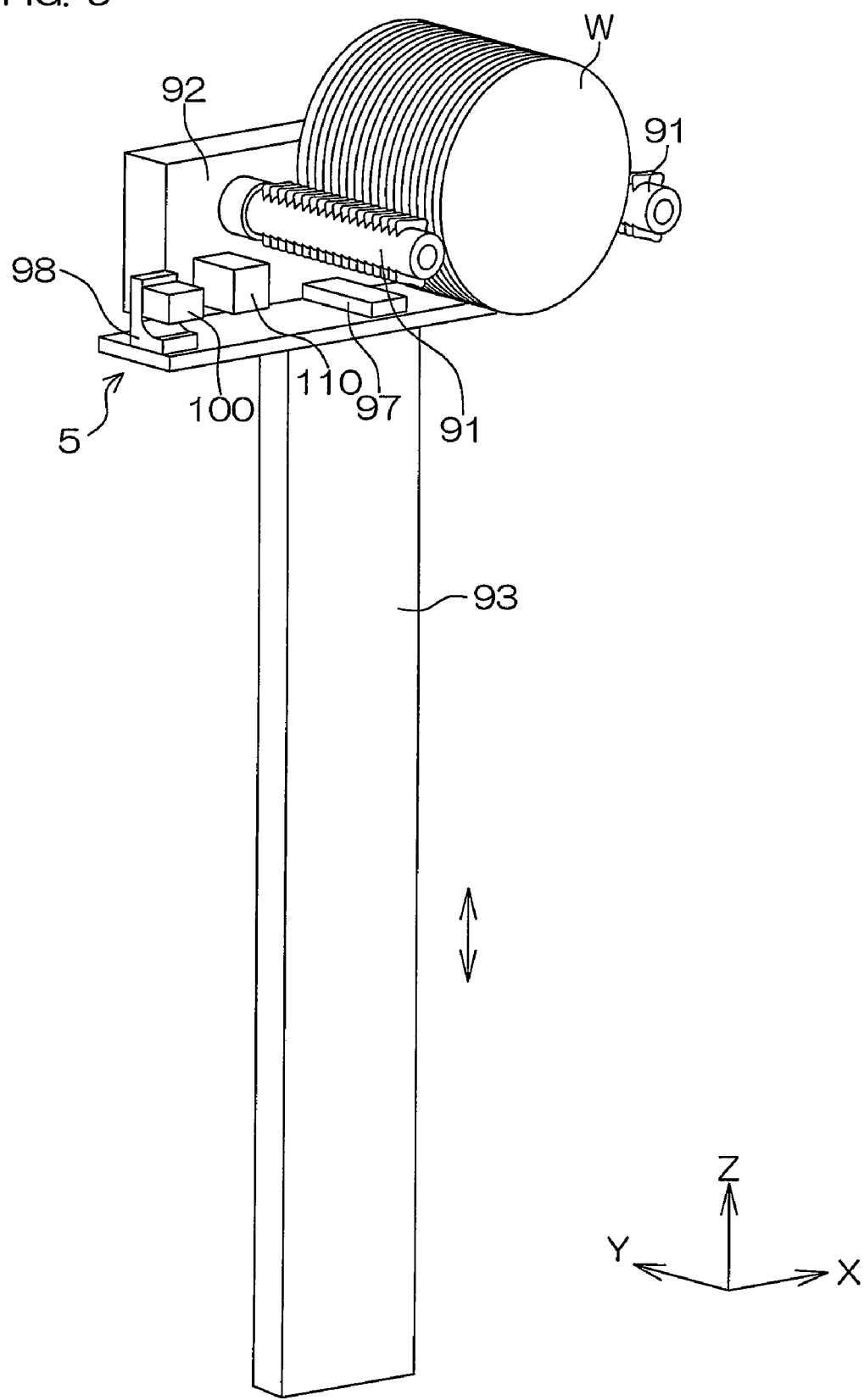
FIG. 9 is a perspective view for describing a construction of a transfer mechanism.

FIG. 9 is a perspective view for describing the construction of the transfer mechanism 5. The transfer mechanism 5 has a pair of support guide shafts 91 extending in the Y direction, and the pair of support guide shafts 91 are opposed to each other in the X direction. The support guide shafts 91 can function as the transfer support which collectively holds multiple substrates W stacked in the Y direction in the vertical postures.

The pair of support guide shafts 91 are supported on a guide support 92. The guide support 92 is attached to the upper end of a main body 93 so as to linearly reciprocate by a minute distance along the Y direction. The main body 93 is a columnar part extending in the Z direction, and is fitted to the substrate treatment apparatus 10 vertically movably along the Z direction.

Figure 10:
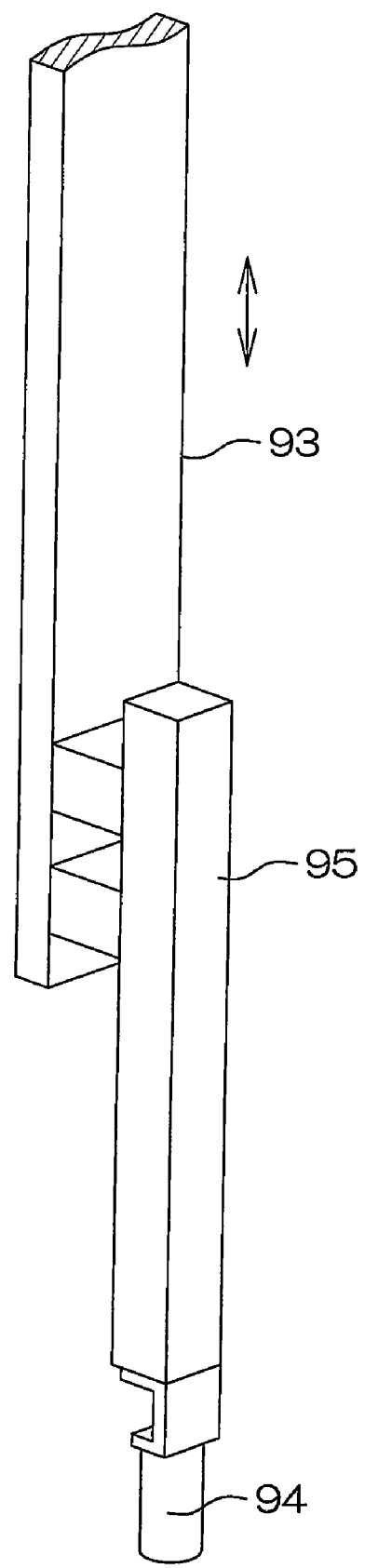
FIG. 10 is a perspective view showing a construction for moving vertically support guide shafts.

As shown in FIG. 10, an actuator 95 as a vertical drive mechanism is connected to the lower end of the main body 93. The actuator 95 is a driving part integrated with a motor 94 as a drive source together with a linear guide and a ball screw, and moves the main body 93 vertically along the Z direction.

Figure 11:
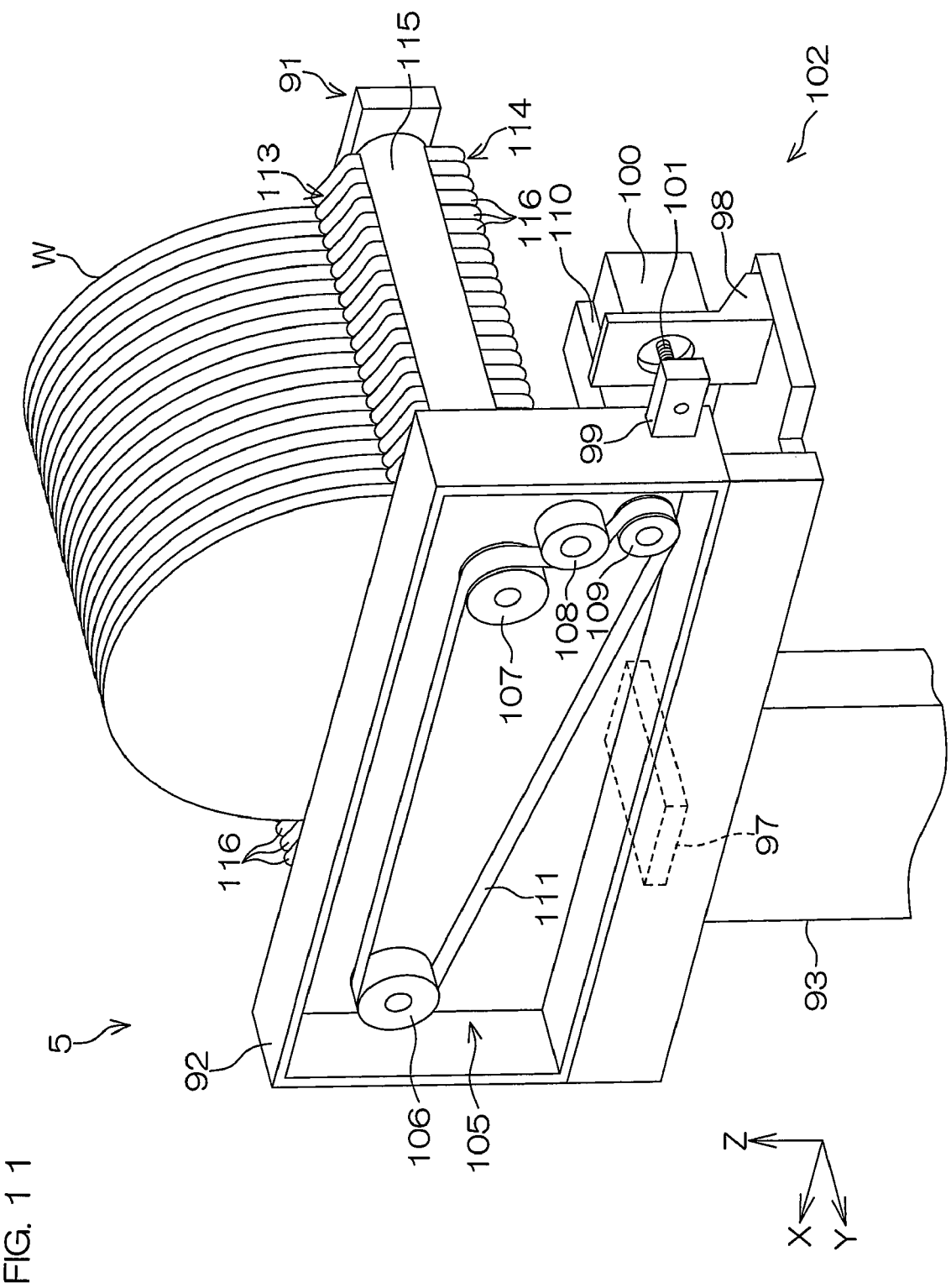
FIG. 11 is a perspective view showing a construction for moving horizontally axially the support guide shaft.

FIG. 11 is a perspective view showing a construction for moving the pair of support guide shafts 91 along the Y direction, viewed from the rear side of FIG. 9. The guide support 92 is attached to the upper end of the main body 93 extending in the Z direction, and is movable on the main body 93 in the Y direction while being guided by the linear guide 97. To the upper surface of the main body 93, a guide moving motor 100 is attached via a bracket 98. A rotation shaft 101 of the guide moving motor 100 is threaded, and this rotation shaft 101 is arranged along the Y direction. The rotation shaft 101 is screwed in a screw hole of a block 99 fixed to a side of the guide support 92. With this construction, the pair of support guide shafts 91 can be advanced and retreated in the Y direction together with the guide support 92 by driving forward/reverse the guide moving motor 100. Thus, the guide moving motor 100, or the like, constitute a support guide horizontal movement mechanism 102 (support horizontal movement mechanism) which horizontally moves the support guide shafts 91.

The guide support 92 is provided with a guide pivotal mechanism 105 for pivoting the pair of support guide shafts 91 around the respective axes. The pair of support guide shafts 91 are attached to the guide support 92 pivotably around the axes. Pulleys 106 and 107 are fixed to the respective base ends of the support guide shafts 91. On the other hand, a guide pivotal motor 110 and a tension pulley 108 are attached to the guide support 92. To the rotation shaft of the guide pivotal motor 110, a pulley 109 is fixed. A belt (toothed belt) 111 is wound around the pulleys 106, 107, and 109, and a tension is applied from the outside of this belt 111 by the tension pulley 108. With this construction, the pair of support guide shafts 91 can be pivoted in conjunction with each other around the axes by driving the guide pivotal motor 110.

Figure 12:
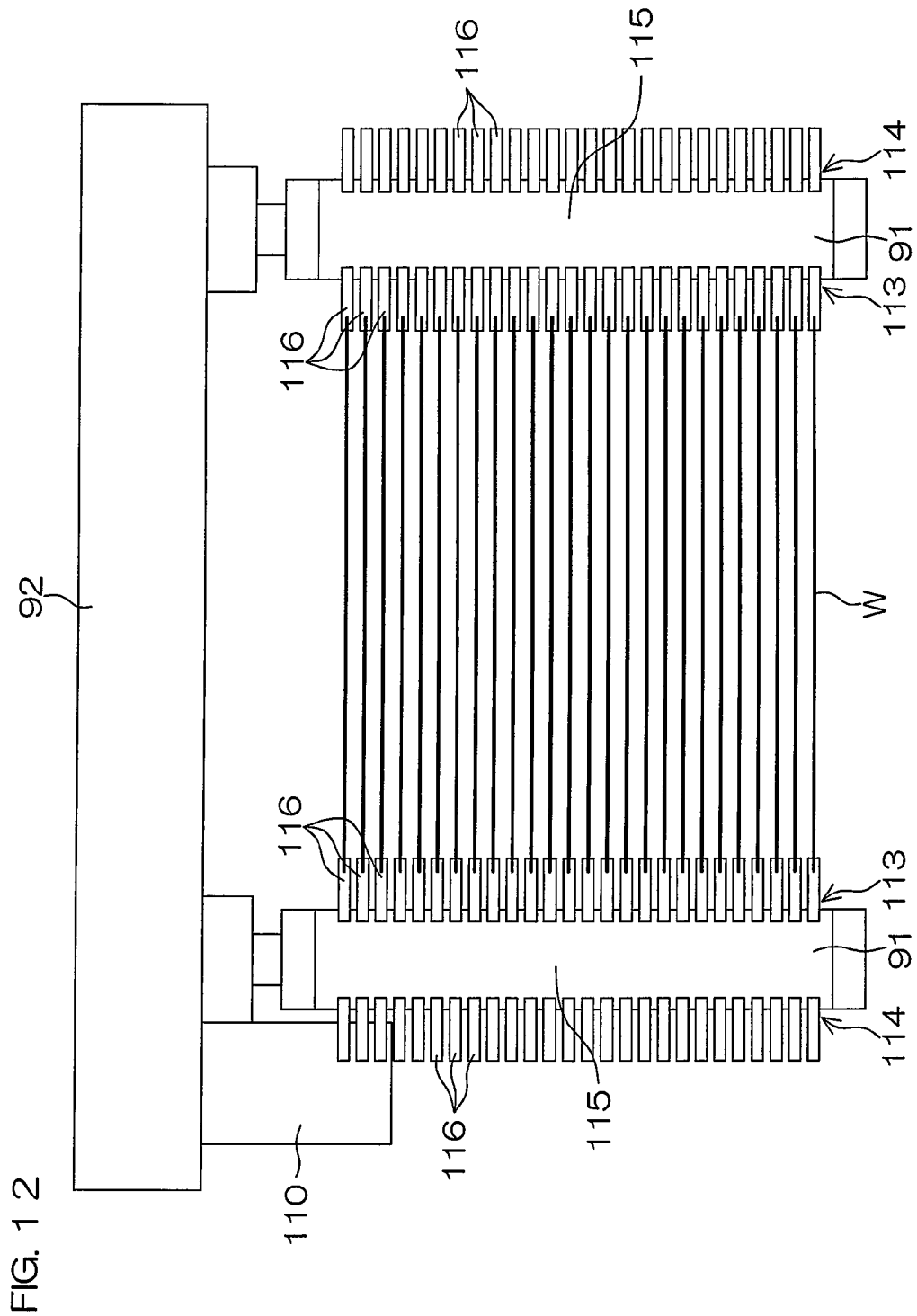
FIG. 12 is a plan view (substrate supporting state) for describing a construction of the support guide shafts.

FIG. 12 is a plan view for describing the construction of the support guide shafts 91. The support guide shaft 91 has a first contact portion 113 and a second contact portion 114 at circumferentially different positions (positions different by 180 degrees from each other in this embodiment), and two positions therebetween is defined as retract portions 115. The first and second contact portions 113 and 114 are formed by aligning axially a plurality of tooth-like projections 116 projecting in directions orthogonal to the axial directions of the support guide shafts 91. Supporting grooves in which the peripheral edges of the substrates W are received and supported are formed at the tip ends of the respective tooth-like projections 116. The tooth-like projections 116 are not formed on the retract portion 115.

Figure 13:
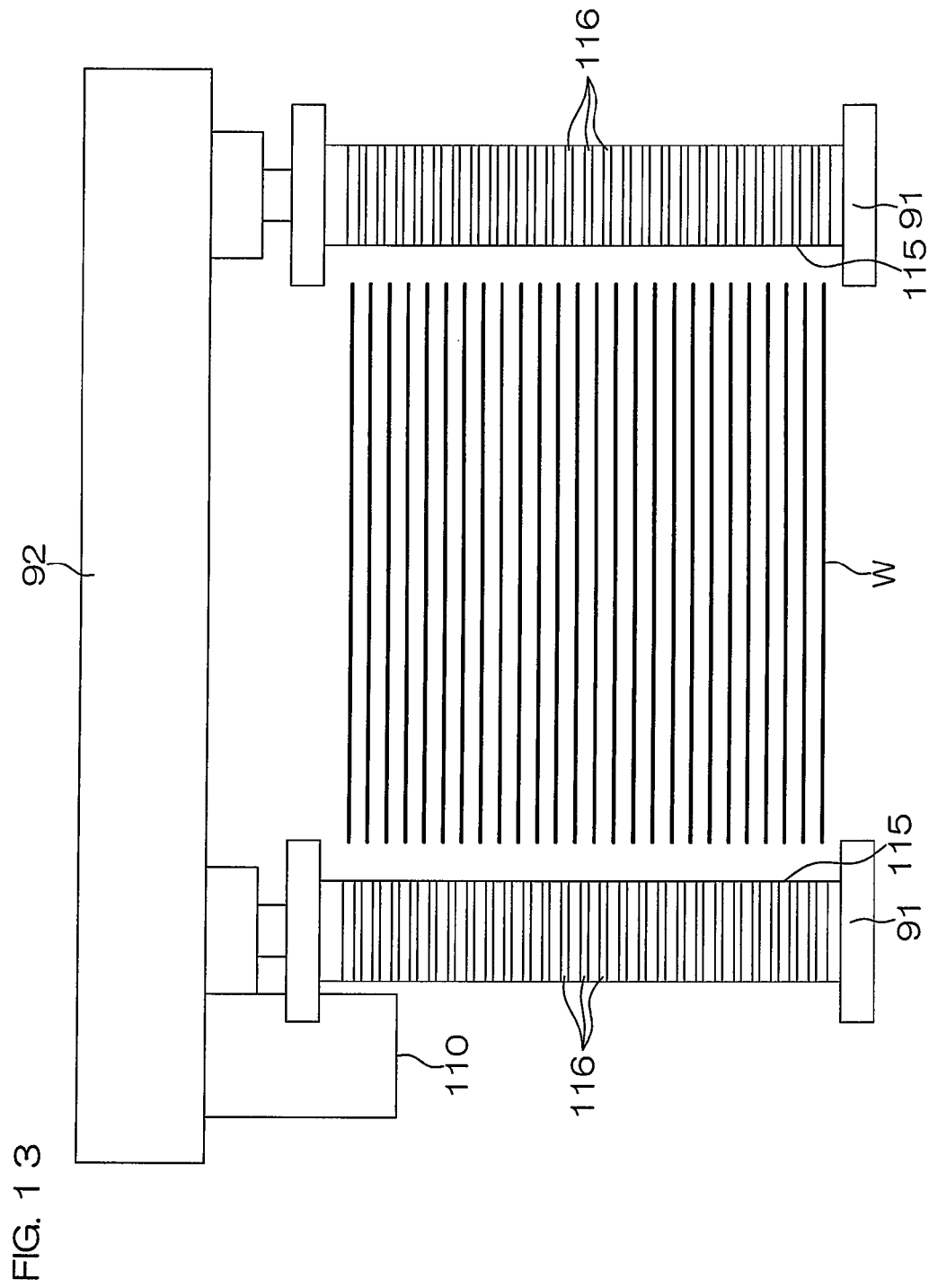
FIG. 13 is a plan view (substrate passing state) for describing the construction of the support guide shafts.

Rotation of the support guide shafts 91 by the guide pivotal mechanism 105 can produce a first supporting state (see FIG. 12) that the first contact portions 113 of the pair of support guide shafts 91 are opposed to each other, a second supporting state that the second contact portions 114 are opposed to each other, or a retract state that the retract portions 115 are opposed to each other (see FIG. 13).

In the first supporting state, the distance between the first contact portions 113 of the pair of support guide shafts 91 is narrower than the diameter of the substrates W. Therefore, the multiple substrates W in the vertical postures can be collectively held by the pair of support guide shafts 91. Likewise, in the second supporting state, the distance between the second contact portions 114 of the pair of support guide shafts 91 is narrower than the diameter of the substrates W. Therefore, the multiple substrates W in the vertical postures can be collectively held by the pair of support guide shafts 91. For example, by control of the guide pivotal motor 110 to produce the first supporting state when untreated substrates W are held and the second supporting state when treated substrates W are held, untreated substrates W and treated substrates W can be held by switching the first and second contact portions 113 and 114.

In the retract state, as shown in FIG. 13, the distance between the pair of support guide shafts 91 is longer than the diameter of the substrates W. Therefore, the substrates W in the vertical postures can pass through between the pair of support guide shafts 91.

[Construction of First Horizontal Conveyance Mechanism]

Figure 14:
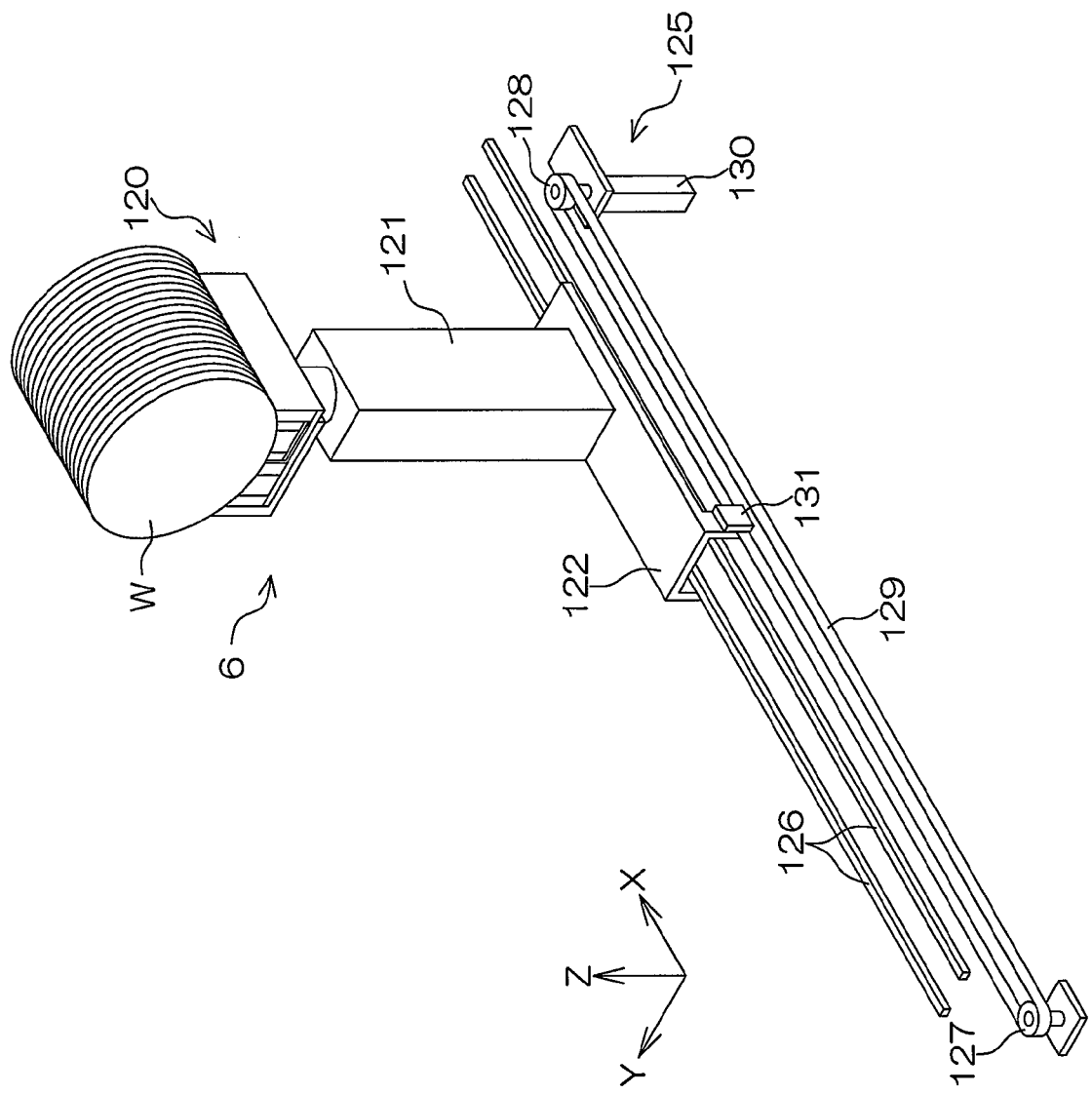
FIG. 14 is a perspective view for describing a construction of a first horizontal conveyance mechanism.

FIG. 14 is a perspective view for describing the construction of the first horizontal conveyance mechanism 6. The first horizontal conveyance mechanism 6 includes a first horizontal conveyance holder 120 which collectively holds multiple substrates W in the vertical postures, a main body 121 which supports the first horizontal conveyance holder 120 rotatably around a vertical axis, a movable base 122 on which this main body 121 is mounted, and a horizontal drive mechanism 125 which horizontally moves the movable base 122 along the X direction. The main body 121 has a columnar shape along the Z direction. The first horizontal conveyance holder 120 is attached to the upper end thereof, and the lower end is fixed to the movable base 122.

The horizontal drive mechanism 125 includes a pair of linear guides 126 which guide horizontal movements along the X direction of the movable base 122. A driven pulley 127 is disposed at one end side of the linear guides 126, and a drive pulley 128 is disposed at the other end side of the linear guides 126. A rotation shaft of a horizontal conveyance motor 130 is connected to the drive pulley 128. A belt (toothed belt) 129 is wound around the pulleys 127 and 128, and therefore, the belt 129 has linear portions extending in the X direction by the side of the linear guides 126. A belt retainer 131 fixed to the movable base 122 is connected to the linear portions of the belt 129. With this construction, rotating forward/reverse the horizontal conveyance motor 130 can linearly move the movable base 122 in the X direction, and therefore, the horizontal conveyance holder 120 can be linearly moved in the X direction.

Figure 15:
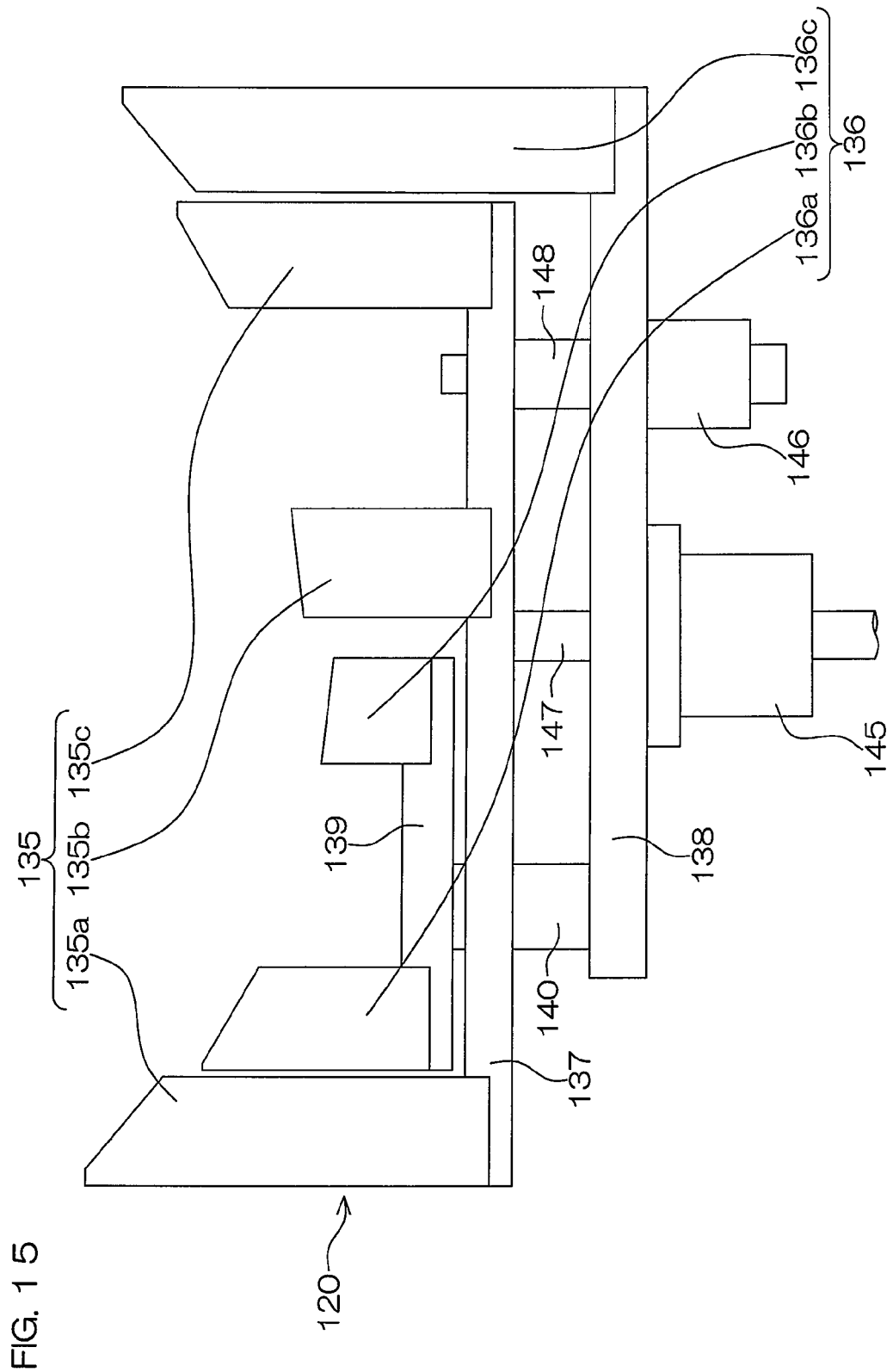
FIG. 15 is a front view in an enlarged manner of a construction of a horizontal conveyance holder.
Figure 16:
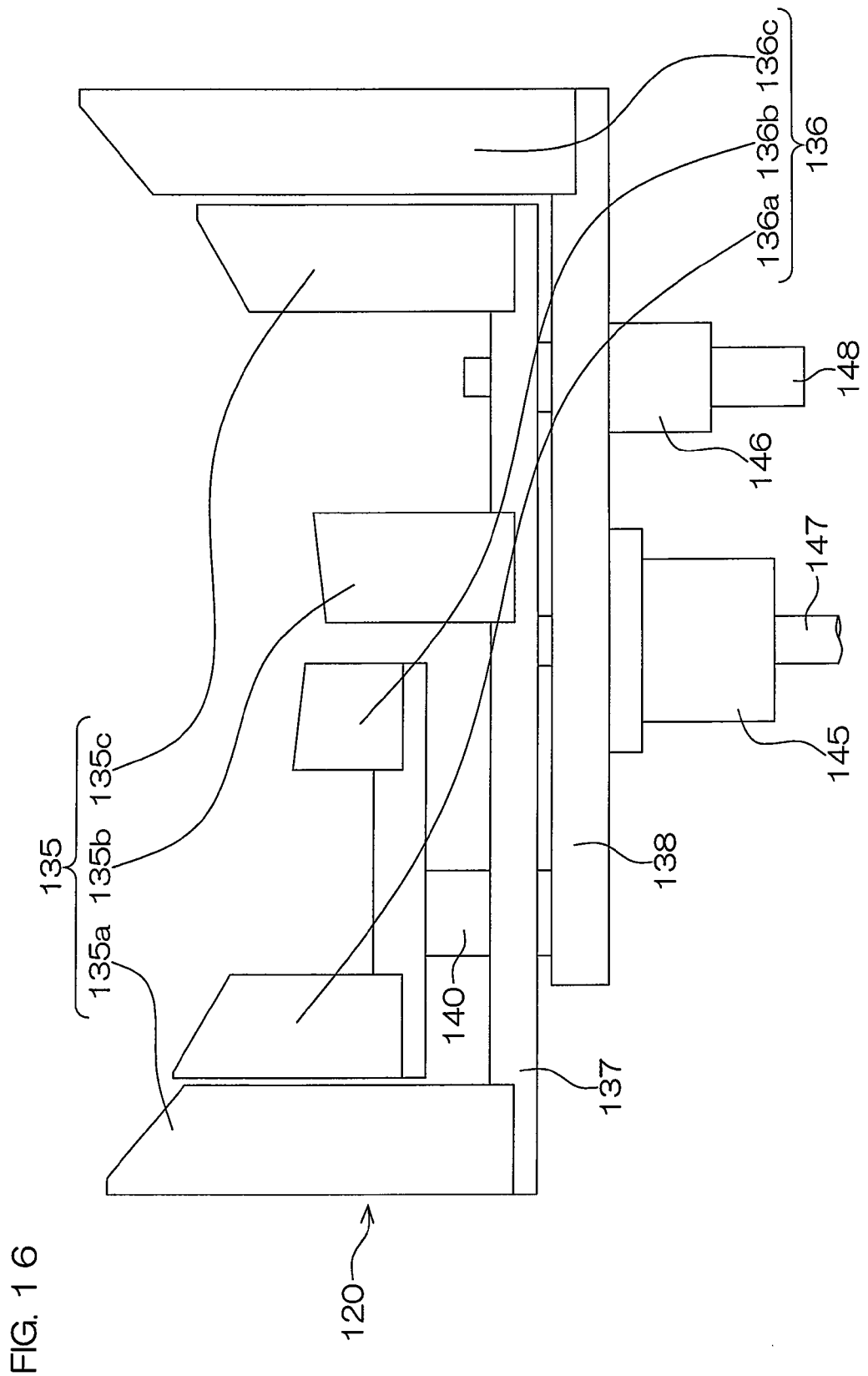
FIG. 16 is a front view in an enlarged manner of the construction of the horizontal conveyance holder.

FIG. 15 and FIG. 16 are front views in an enlarged manner of the construction of the first horizontal conveyance holder 120 (front views from the X direction). The horizontal conveyance holder 120 includes a first guide 135 and a second guide 136.

The first guide 135 has three support members 135a, 135b, and 135c arranged parallel along the horizontal direction, and these are supported on a first guide base 137. On the upper surface of each of the three support members 135a, 135b, and 135c, multiple (for example, 50) substrate holding grooves are formed and aligned in the longitudinal direction of each of the support members 135a, 135b, and 135c. Three substrate holding grooves along the vertical planes orthogonal to the longitudinal directions of the support members 135a, 135b, and 135c (substrate holding grooves formed on the respective support members 135a, 135b, and 135c) come into contact with different positions of the lower edge of one substrate W in the vertical posture, and hold this substrate W in the vertical posture. Thus, the first guide 135 can collectively hold multiple substrates W in the vertical postures. The substrate holding grooves are arranged at half the intervals (half pitches) of the holding intervals of the substrates W inside the FOUP F.

Likewise, the second guide 136 has three support members 136a, 136b, and 136c arranged parallel along the horizontal direction, and these are supported on a second guide base 138. On the upper surface of each of the three support members 136a, 136b, and 136c, multiple (for example, 50) substrate holding grooves are formed and aligned in the longitudinal direction of each of the support members 136a, 136b, and 136c. Three substrate holding grooves along vertical planes orthogonal to the longitudinal directions of the support members 136a, 136b, and 136c (substrate holding grooves formed on the respective support members 136a, 136b, and 136c) come into contact with different positions of the lower edge of one substrate W in the vertical posture, and hold this substrate W in the vertical posture. Thus, the second guide 136 can collectively hold multiple substrates W in the vertical postures. The substrate holding grooves are formed at half the intervals (half pitches) of the holding intervals of the substrates W inside the FOUP F.

One support member 136c of the second guide 136 is directly attached to the second guide base 138. However, the remaining two support members 136a and 136b are supported on a sub guide base 139, and this sub guide base 139 is supported on the second guide base 138 via a support shaft 140. The second guide base 138 is positioned lower than the first guide base 137, and the support shaft 140 penetrates through an insertion hole formed in the first guide base 137 and reaches the second guide base 138.

Two linear bushes 145 and 146 are fixed onto the lower surface of the second guide base 138. A rotation shaft 147 is inserted in one linear bush 145, and a shaft 148 is inserted in the other linear bush 146. The upper ends of the rotation shaft 147 and the shaft 148 are both fixed to the first guide base 137.

Guiding the rotation shaft 147 and the shaft 148 along the Z direction by the linear bushes 145 and 146 can elevate the first guide base 137 in the Z direction relative to the second guide base 138. In other words, the first guide 135 can be vertically moved with respect to the second guide 136. Rotation of the rotation shaft 147 around its axis rotates the first guide base 137 around the rotation shaft 147, and this rotation is transmitted to the second guide base 138 via the linear bush 146 and the shaft 148. Thus, the first and second guides 135 and 136 can be rotated in conjunction with each other.

With vertical movement of the first guide 135 relative to the second guide 136, switching can be made between a first supporting state (state of FIG. 15) that the substrate supporting position of the first guide 135 is set higher than the substrate supporting position of the second guide 136 and a second supporting state (see FIG. 16) that the substrate supporting position of the second guide 136 is set higher than the substrate supporting position of the first guide 135. Accordingly, for example, when untreated substrates W are supported, the first supporting state is set to support the substrates W by the first guide 135. On the other hand, when supporting treated substrates W are supported, the second supporting state is set to support the substrates W by the second guide 136.

With horizontal rotation of the first and second guides 135 and 136 around the vertical axis (for example, by 90 degrees), the substrate alignment direction can be changed between the alignment direction of the substrates W in the transfer mechanism 5 and the alignment direction of the substrates W in the main conveyance mechanism 3. Further, it is possible that, after receiving and holding, for example, 25 substrates W from the transfer mechanism 5, the first horizontal conveyance holder 120 (guides 135 and 136) are horizontally rotated by 180 degrees around the vertical axis so as to further receive another 25 substrates W from the transfer mechanism 5. In this case, substrates W made of the first substrate group of 25 substrates and substrates W made of the latter substrate group of 25 substrates are alternately horizontally stacked and held by the horizontal conveyance holder 120. In the FOUP F, multiple substrates W are held while their device forming surfaces are directed toward the same side. Accordingly, the 50 substrates W on the horizontal conveyance holder 120 are held so that device forming surfaces or non-device forming surfaces of adjacent substrates are opposed to each other.

Figure 17:
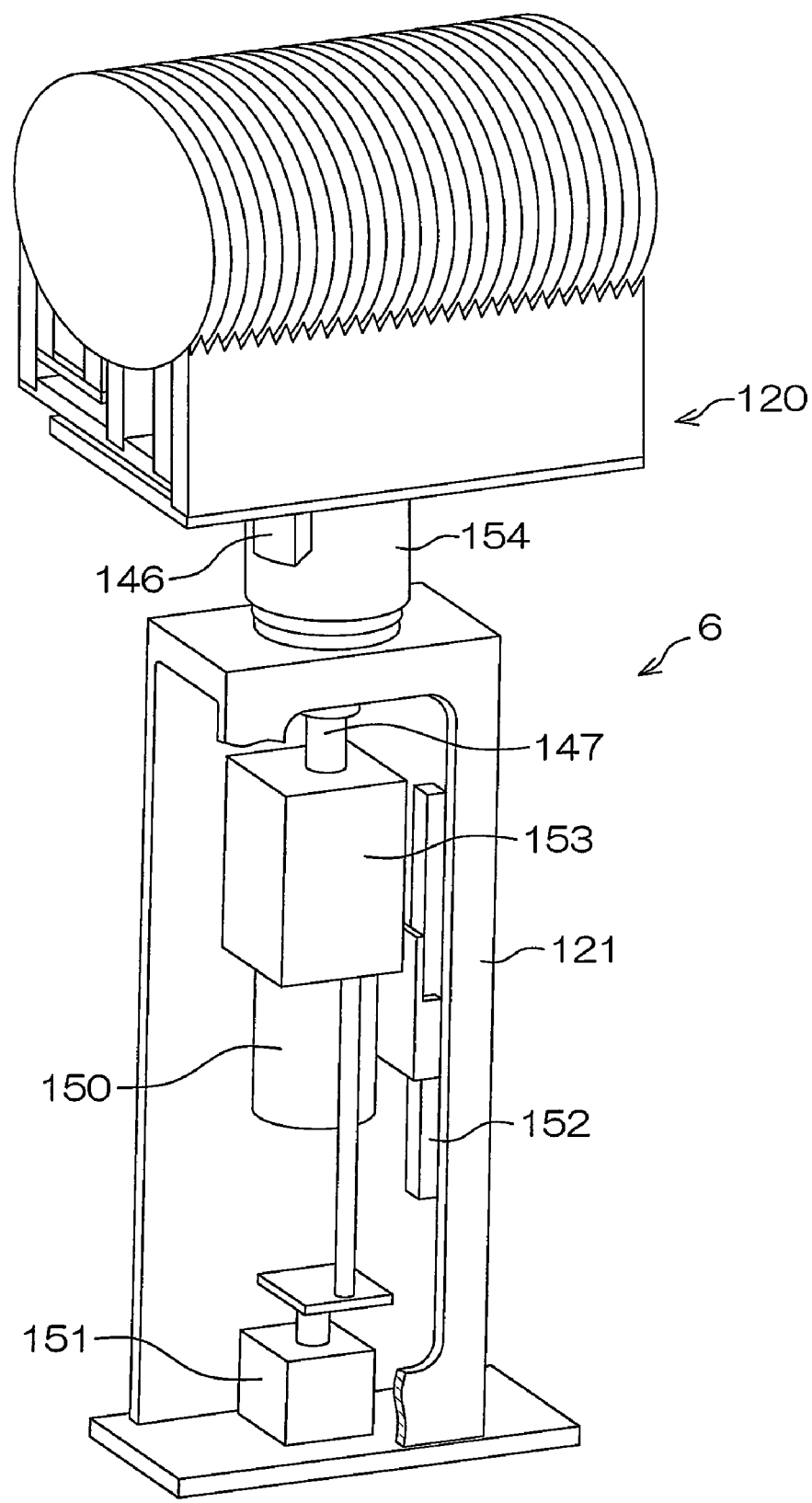
FIG. 17 is a perspective view for describing a construction for horizontal rotation of the horizontal conveyance holder and elevation of a first guide base.
Figure 18:
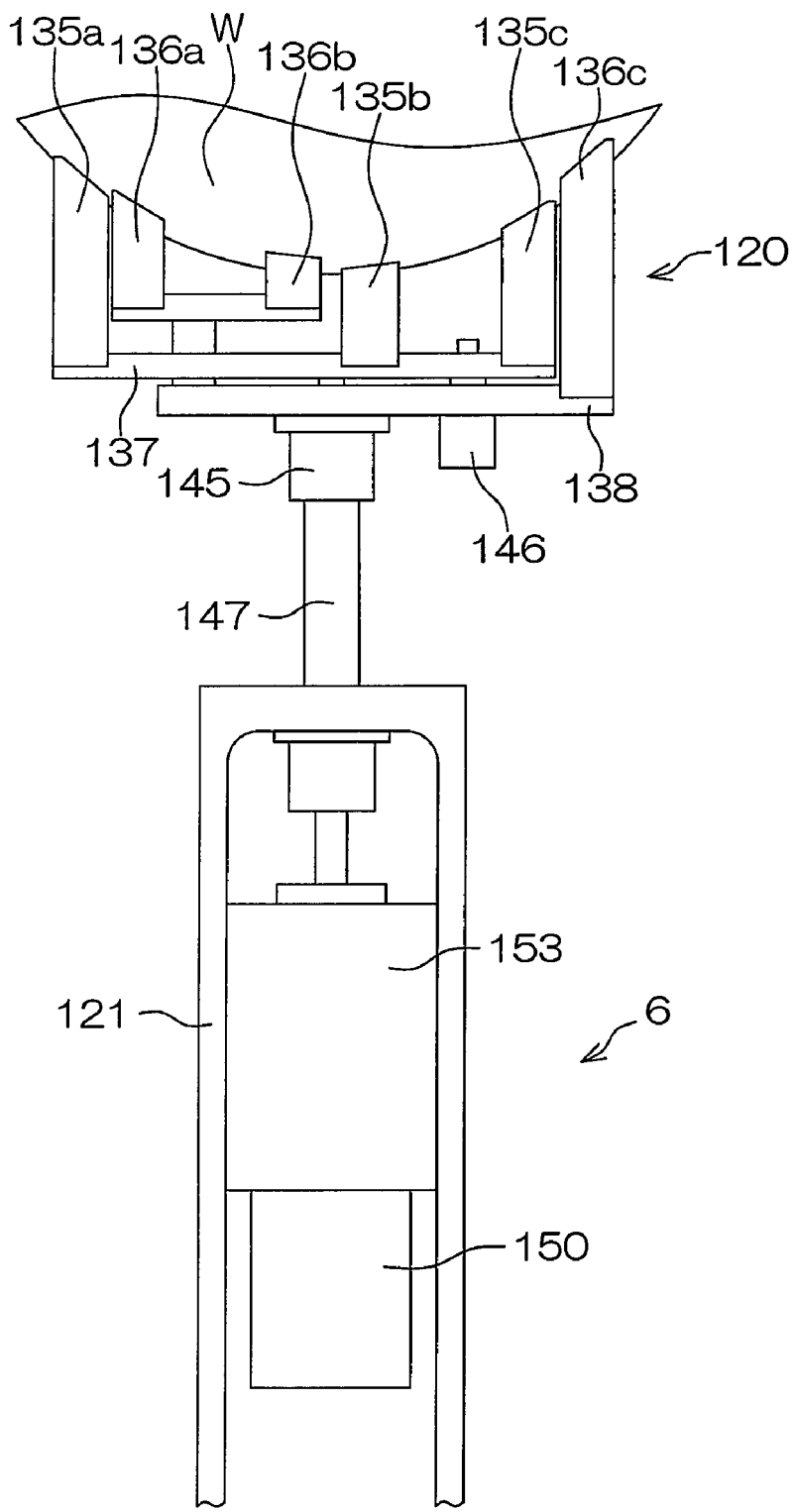
FIG. 18 is a side view for describing the construction for horizontal rotation of the horizontal conveyance holder and elevation of the first guide base.

FIG. 17 is a perspective view for describing a construction for horizontally rotating the first horizontal conveyance holder 120 and elevating the first guide base 137, and FIG. 18 is a side view of the same. A guide rotating motor 150 as a horizontal rotation mechanism for rotating the rotation shaft 147 and an air cylinder 151 as a guide elevating mechanism for vertically moving the guide rotating motor 150 are housed inside the main body 121. On the inner wall of the main body 121, a linear guide 152 is arranged along the Z direction, and a guide unit 153 is movable in the Z direction along this linear guide 152. The guide rotating motor 150 is attached to this guide unit 153, and the rotation shaft 147 is inserted through the guide unit 153. On the other hand, onto the upper surface of the main body 121, a bearing 154 (illustration omitted in FIG. 18) is attached which can rotate around the vertical axis with respect to the main body 121 and in which the rotation shaft 147 is inserted. The linear bush 146 is fixed to the rotary portion of this bearing 154. With this construction, driving the air cylinder 151 can move the rotation shaft 147 vertically together with the guide rotating motor 150. Accordingly, the first guide 135 can be elevated with respect to the second guide 136. Further, rotation of the rotation shaft 147 by driving the guide rotating motor 150 can horizontally rotate the horizontal conveyance holder 120.

[Construction of Second Horizontal Conveyance Mechanism]

Figure 19:
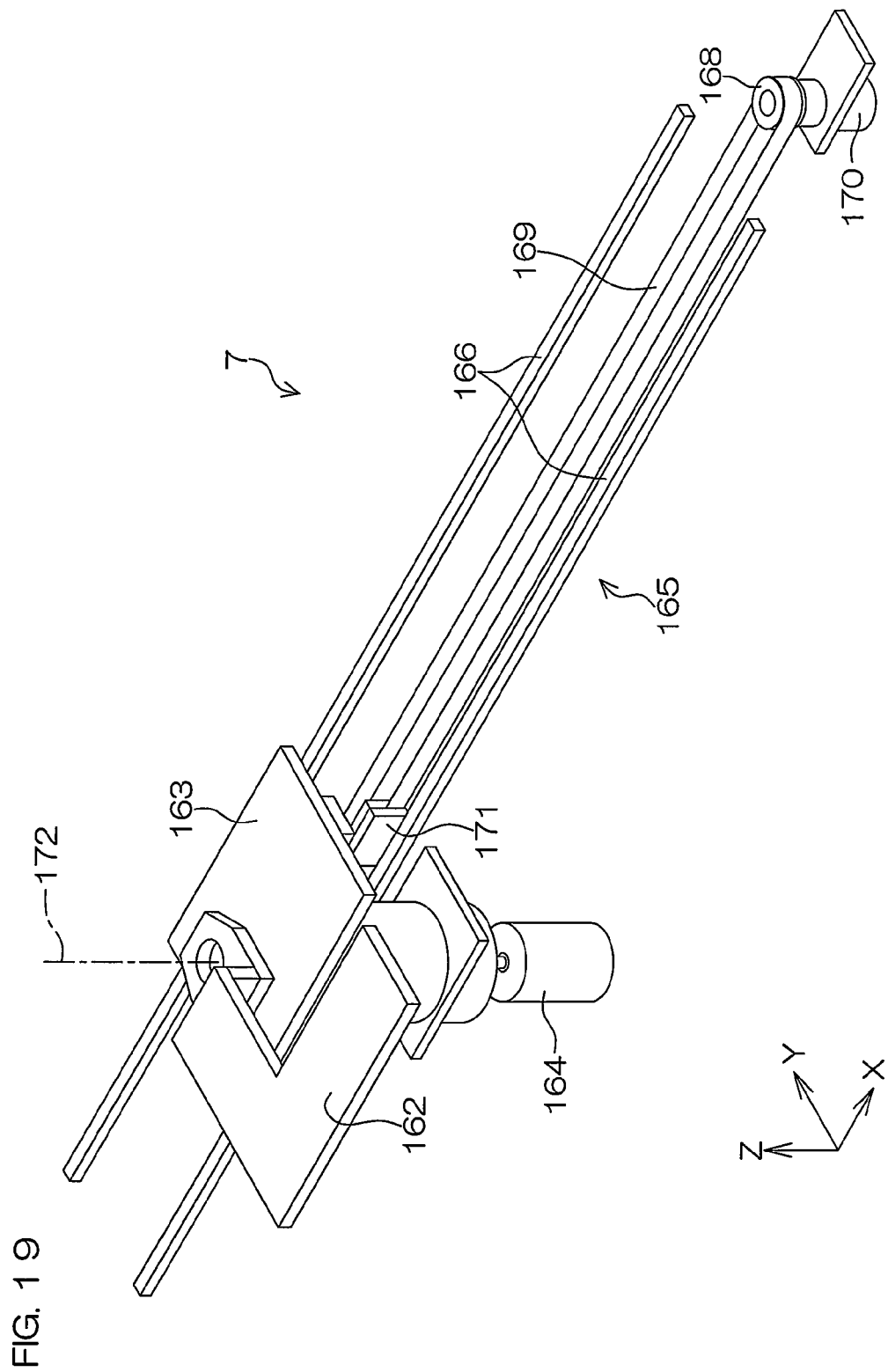
FIG. 19 is a perspective view for describing a construction of a second horizontal conveyance mechanism.

FIG. 19 is a perspective view for describing a part of the construction of the second horizontal conveyance mechanism 7. Reference is made to both FIG. 19 and FIG. 2 described above.

The second horizontal conveyance mechanism 7 has a construction similar to that of the first horizontal conveyance mechanism 6, and includes a second horizontal conveyance holder 160 which collectively holds multiple substrates W in the vertical postures, a main body 161 which supports the horizontal conveyance holder 160 rotatably around the vertical axis, a rotatable base 162 on which the main body 161 is mounted, a movable base 163 which supports the rotatable base 162 rotatably around the vertical axis, and a horizontal drive mechanism 165 which moves horizontally the movable base 163 along the X direction. The main body 161 has a columnar shape along the Z direction. The horizontal conveyance holder 160 is attached to the upper end thereof, and the lower end is fixed to the rotatable base 162.

The horizontal drive mechanism 165 includes a pair of linear guides 166 which guides horizontal movements along the X direction of the movable base 163. Near one ends of the linear guides 166, a driven pulley (not shown) is disposed between the pair of linear guides 166, and on the other end sides of the linear guides 166, a drive pulley 168 is disposed between the pair of linear guides 166. A rotation shaft of a horizontal conveyance motor 170 is connected to the drive pulley 168. A belt (toothed belt) 169 is wound around between the driven pulley and the drive pulley, and therefore, the belt 169 has linear portions extending in the X direction between the pair of linear guides 166. A belt retainer 171 fixed to the movable base 163 is connected to the linear portions of the belt 169. With this construction, driving forward/reverse the horizontal conveyance motor 170 can linearly move the movable base 163 along the X direction, and therefore, the second horizontal conveyance holder 160 can be linearly moved along the X direction.

The rotatable base 162 is attached to the movable base 163 so as to be swivable around the vertical axis 172. A swivel motor 164 is fixed to the movable base 163, and a rotation shaft of this swivel motor 164 is connected to the rotatable base 162. With this construction, driving the turning motor 164 can rotate the second horizontal conveyance holder 160 around the vertical axis 172 together with the rotatable base 162. The rotatable base 162 is formed into substantially an L shape, and the main body 161 is mounted at a position deviating from the vertical axis 172. Therefore, by the rotation of the rotatable base 162, the horizontal conveyance holder 160 can be moved between one side and the other side of the linear guide 166 in a plan view.

Figure 20:
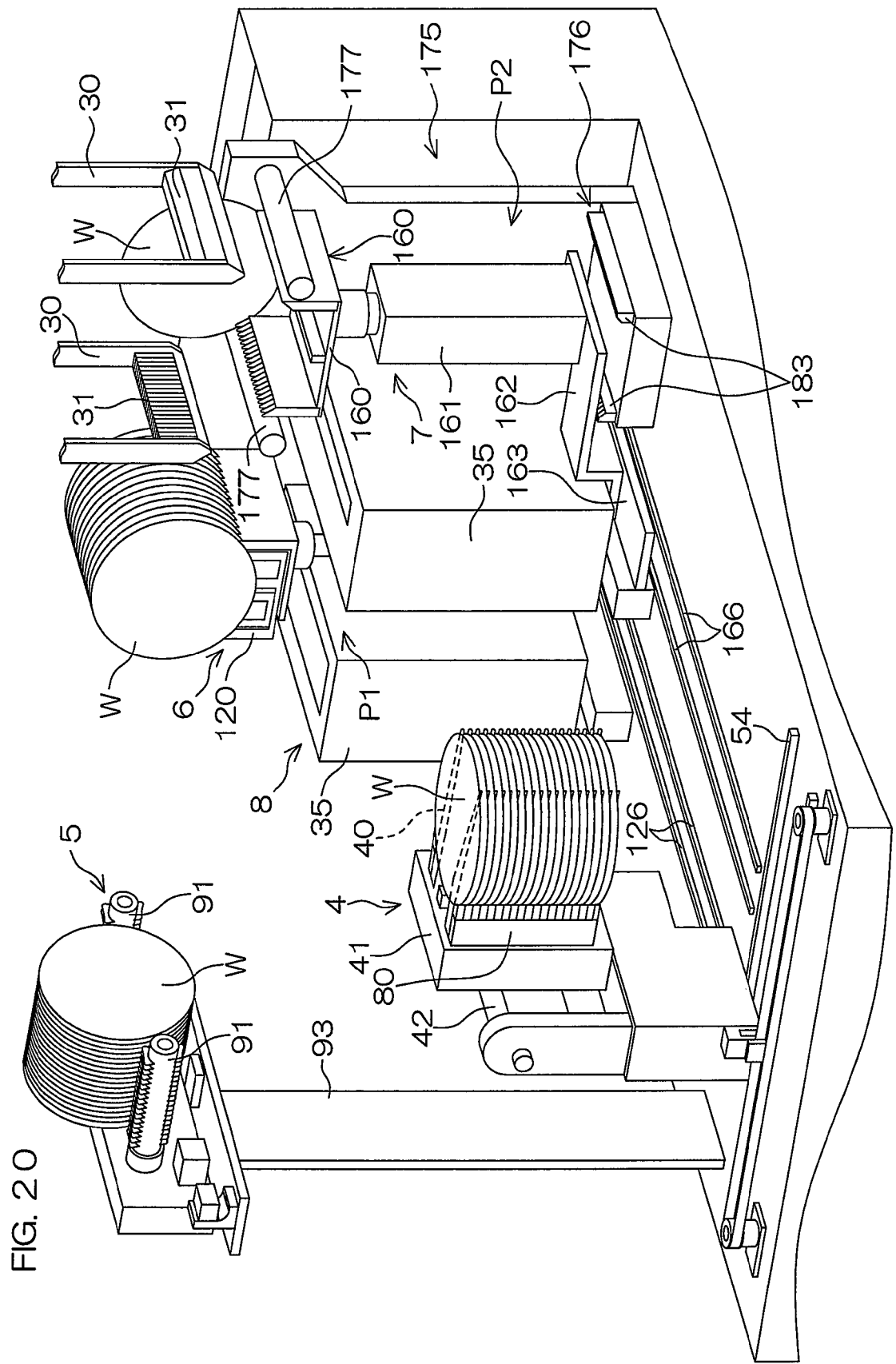
FIG. 20 is a perspective view showing a state that the horizontal conveyance holder is positioned on the front face side of the substrate treatment apparatus.

FIG. 20 is a perspective view showing a state that the second horizontal conveyance holder 160 is positioned on the front face 10a side of the substrate treatment apparatus 10. The linear guides 166 are disposed parallel to the linear guides 126 of the first horizontal conveyance mechanism 6, and on the front face 10a side of the substrate treatment apparatus 10 that is forward of the linear guides 126. When the second horizontal conveyance holder 160 is positioned on the front face 10a side of the substrate treatment apparatus 10 with respect to the linear guides 166, the second horizontal conveyance holder 160 is movable along the X direction while facing the second substrate delivery position P2 in the X direction, and can move to the second substrate delivery position P2.

Figure 21:
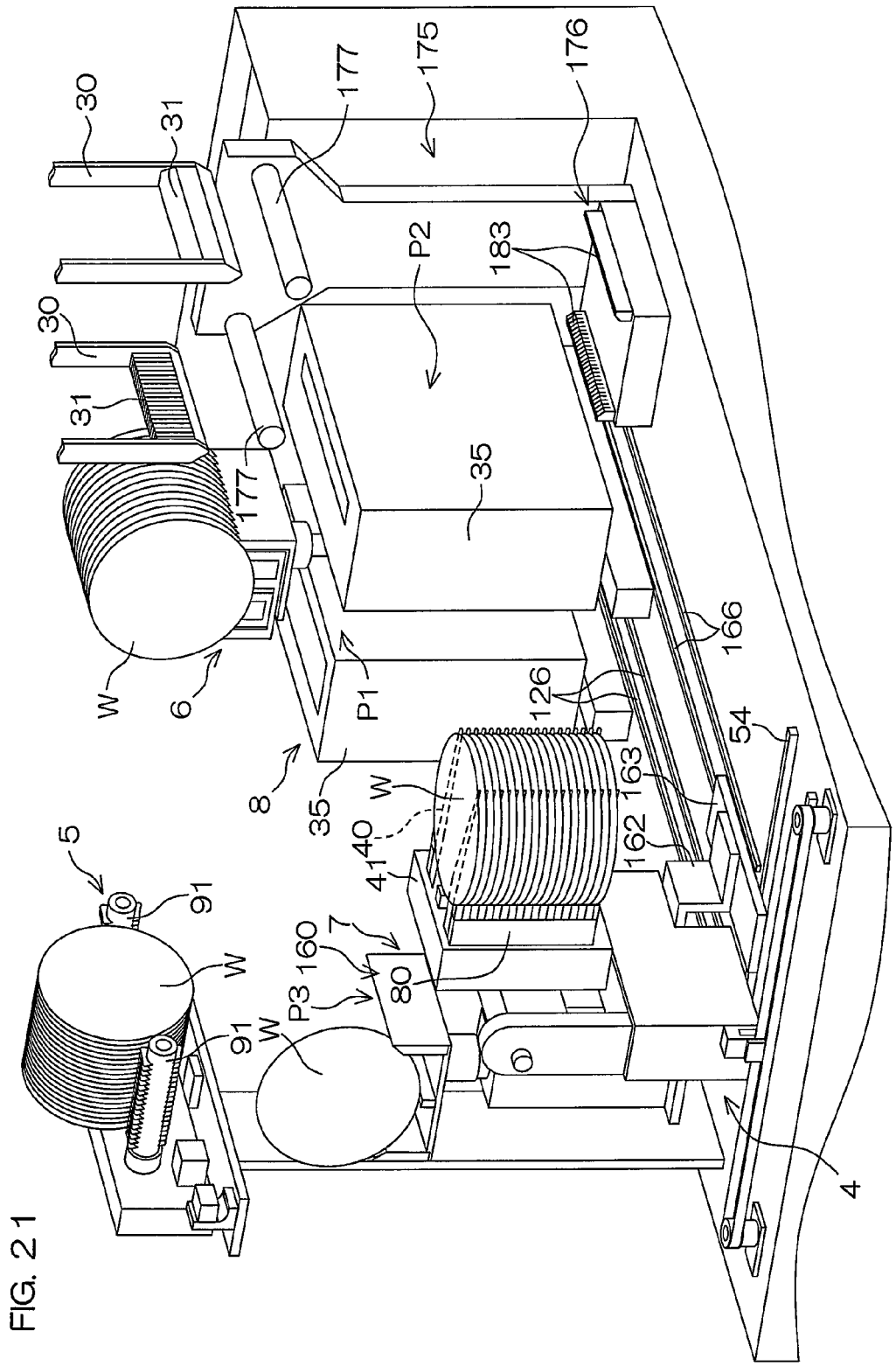
FIG. 21 is a perspective view showing a state that the horizontal conveyance holder is positioned on the substrate treatment section side with respect to a linear guide.

FIG. 21 is a perspective view showing a state that the second horizontal conveyance holder 160 is positioned on the substrate treatment section 2 side with respect to the linear guides 166. In this state, the horizontal conveyance holder 160 is movable along the X direction while facing the transfer position P3 in the X direction, and can move to the transfer position P3.

Therefore, the second horizontal conveyance holder 160 can move along the X direction and swivel around the vertical axis 172, and accordingly, multiple substrates W can be collectively conveyed horizontally between the second delivery position P2 and the transfer position P3.

The detailed construction of the second horizontal conveyance mechanism 7 is similar to that of the first horizontal conveyance mechanism 6. In the description given below, the reference numerals attached to the drawings in relation to the description of the first horizontal conveyance mechanism 6 may also be used for describing the second horizontal conveyance mechanism 7 as appropriate.

[Construction for Substrate Delivery between Second Horizontal Conveyance Mechanism and Main Conveyance Mechanism]

Figure 22:
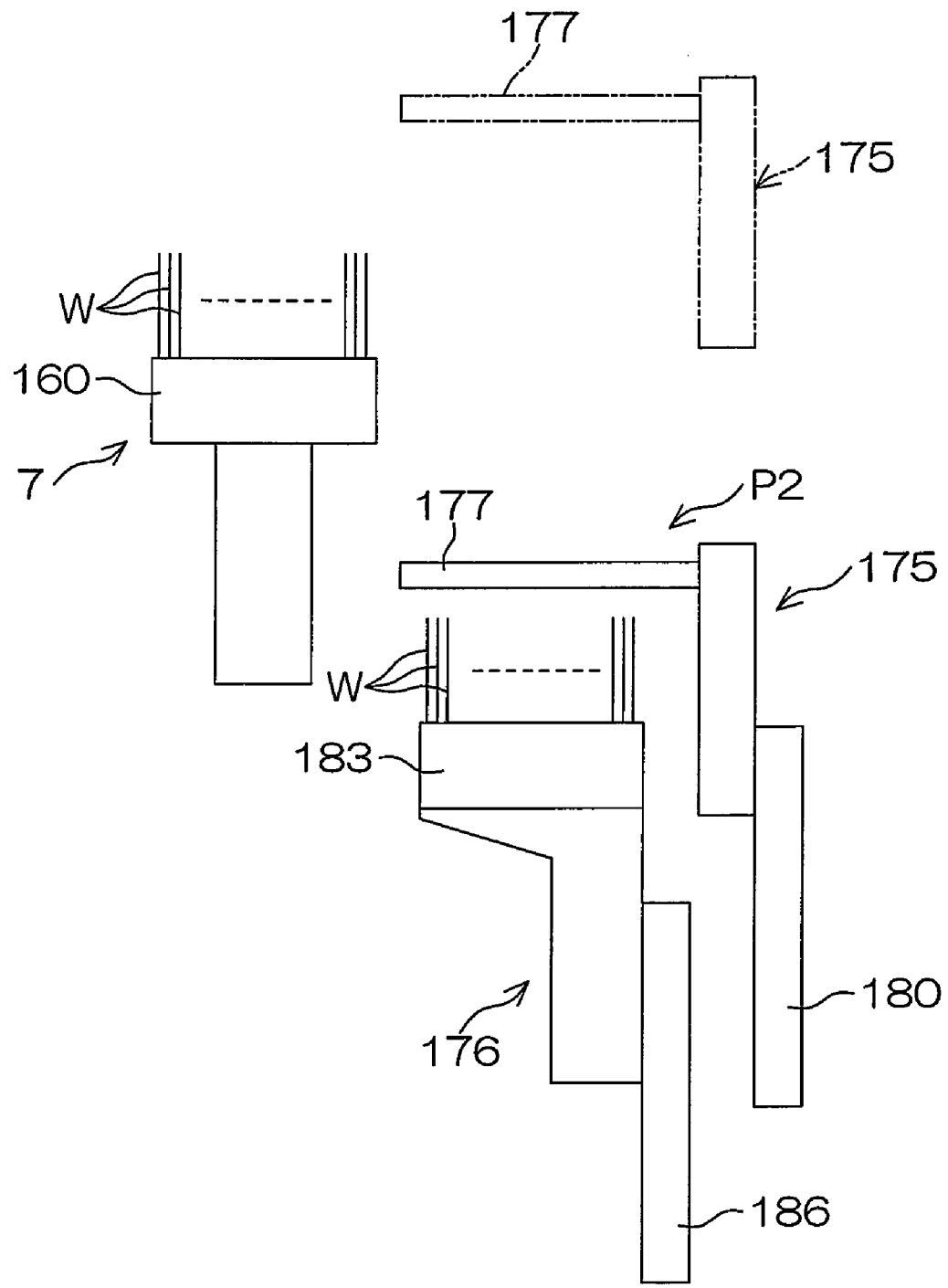
FIG. 22 is a schematic view showing a construction relating to collective delivery of substrates at a second delivery position.

FIG. 22 is a schematic view showing a construction relating to collective delivery of substrates W at the second delivery position P2. A first mediating robot 175 and a second mediating robot 176 constituting a mediating mechanism are provided at the second delivery position P2. The first mediating robot 175 collectively receives multiple (for example, 50) substrates W stacked in the X direction in the vertical postures from the second horizontal conveyance mechanism 7. The second mediating robot 176 collectively receives multiple (for example, 50) substrates W stacked in the X direction in the vertical postures from the first mediating robot 176. The main conveyance mechanism 3 operates to collectively receive multiple substrates W stacked in the X direction in the vertical postures from the second mediating robot 176.

Figure 23:
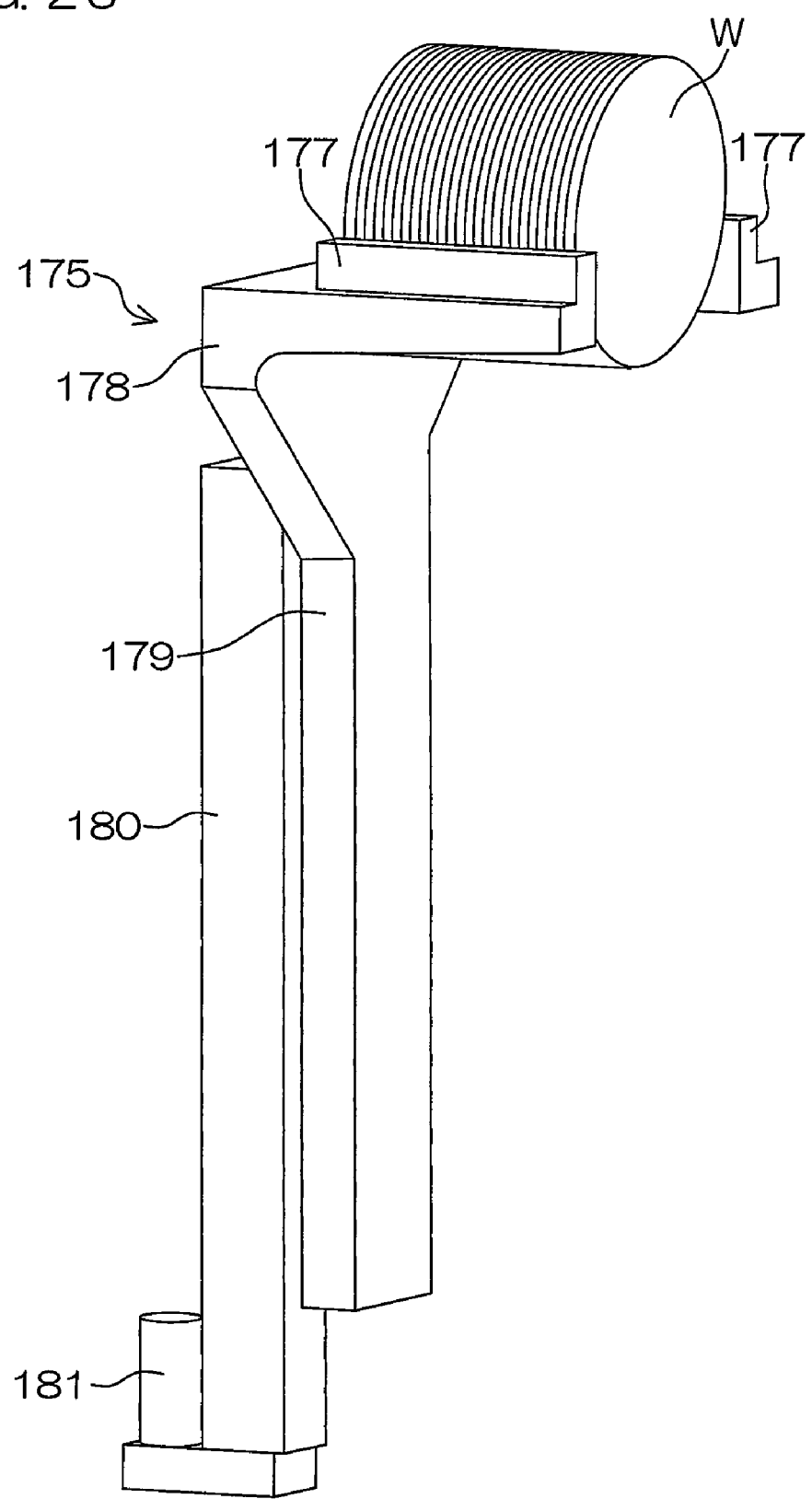
FIG. 23 is a perspective view showing a construction of a first mediating robot.

FIG. 23 is a perspective view showing a construction of the first mediating robot 175. The first mediating robot 175 includes a pair of support guides 177 formed like shafts, a guide support 178 which supports the support guides 177, a main body 179 having the guide support 178 is fixed to the upper end thereof, and an actuator 180 for vertically moving the main body 179. The pair of support guides 177 are opposed to each other at a distance that is wider than the horizontal conveyance holder 160 and narrower than the diameter of the substrates W, and multiple (for example, 50) substrates W in the vertical postures can be collectively held between the support guides. The main body 179 is formed so as to extend vertically. The actuator 180 vertically moves the main body 179 using a motor 181 as a drive source. With this construction, the multiple substrates W held in the vertical postures on the second horizontal conveyance holder 160 can be collectively scooped from below and received.

Figure 24:
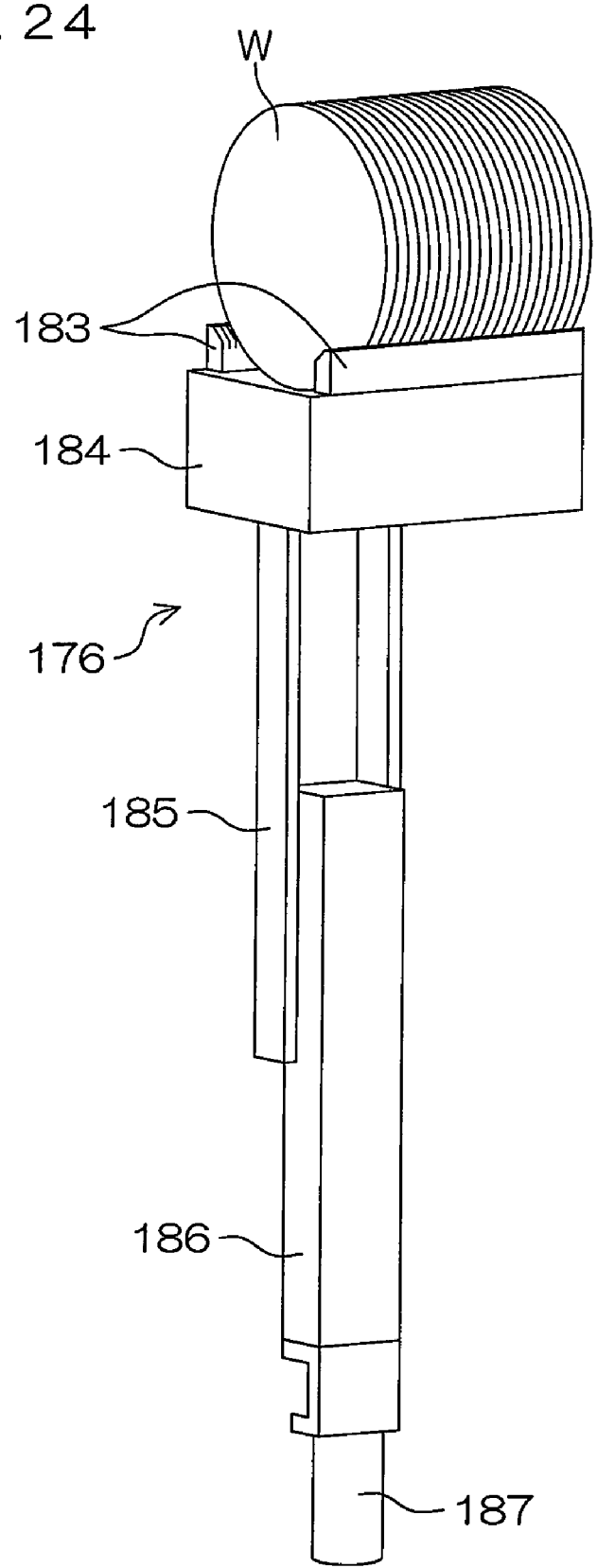
FIG. 24 is a perspective view showing a construction of a second mediating robot.

FIG. 24 is a perspective view showing a construction of the second mediating robot 176. The second mediating robot 176 includes a pair of support guides 183, a guide support 184 which supports the pair of support guides 183, a main body 185 having the guide support 184 is fixed to the upper end thereof, and an actuator 186 for vertically moving the main body 185. The pair of support guides 183 can collectively hold multiple (for example, 50) substrates W in the vertical postures therebetween. The main body 185 is formed so as to extend vertically. The actuator 186 vertically moves the main body 185 using a motor 187 as a drive source. With this construction, multiple substrates W in the vertical postures can be collectively received from the first mediating robot 175 and supported, and can be delivered to the main conveyance mechanism 3.

On the upper end of the main body 185, a substrate orientation alignment mechanism may be mounted instead of the support guides 183. The substrate orientation alignment mechanism aligns the orientations of the multiple substrates (crystalline orientations in the case of semiconductor wafers) by aligning the orientations of, for example, notches formed in the semiconductor wafers. By providing both the first mediating robot 175 and the second mediating robot 176, the substrate delivery operation at the second substrate delivery position P2 can be performed without great changes in construction even in both cases with and without the substrate orientation alignment mechanism.

[Operation of Substrate Treatment Apparatus]

Next, the operation of the substrate treatment apparatus 10 will be described.

This operation is realized by controlling the operation of the respective parts of the substrate treatment section 2, the main conveyance mechanism 3, the carrying in/out mechanism 4, the transfer mechanism 5, the first horizontal conveyance mechanism 6, the second conveyance mechanism 7, the chuck cleaning unit 8, and the like by the controller 9. In particular, the controller 9 functions as a transfer control unit which controls the carrying in/out mechanism 4, the transfer mechanism 5, and the first and second horizontal conveyance mechanisms 6 and 7, and functions as a conveyance control unit which controls the operation of the main conveyance mechanism 3.

[Carrying Untreated Substrates W Out of FOUP F]

When a FOUP F containing multiple (for example, 25) untreated substrates W is held by the FOUP holder 1, the carrying in/out mechanism 4 collectively carries out the plurality of untreated substrates W stacked in the Z direction in the horizontal postures inside of the FOUP. In detail, an opener for removing the cover of the FOUP F is disposed in the FOUP holder 1. After removing the cover of the FOUP F with this opener, the number of substrates W in the FOUP F is confirmed with a sensor.

When untreated substrates W are carried out of the FOUP F, the carrying in/out mechanism 4 turns the batch hand 40 into the horizontal posture, advances the batch hand 40 in the Y direction toward the FOUP F by the hand advancing and retreating mechanism 44, and inserts the plurality of hand elements 70 between the substrates W. At this time, the batch hand 40 is controlled in a posture in which the first support surfaces 71 of the hand elements 70 are turned upward.

Then, by the actuator 65, the batch hand 40 is raised by a minute distance. Accordingly, the batch hand 40 scoops up a plurality of untreated substrates W simultaneously. In this state, by the hand advancing and retreating mechanism 44, the batch hand 40 is retracted from the FOUP F to a posture changing position, and accordingly, the multiple substrates W inside the FOUP F are collectively carried out.

[Posture Change of Untreated Substrates W]

The substrates W carried out of the FOUP F are held in the stacked state in the Z direction in the horizontal postures by the batch hand 40. From this state, by driving the swiveling motor 50, the hand support 41 is swiveled by 90 degrees along the YZ plane. Accordingly, the batch hand 40 is pulled up so that the support guides 80 turn downward and the tip ends of the hand elements 70 turn upward. As a result, the multiple substrates W are changed in posture into a stacked state in the Y direction in the vertical postures. According to this posture change, the multiple substrates W are guided to the transfer position P3.

Previous to the posture change, the support guides 80 are controlled by the guide drive mechanism 89 so that the first substrate holding grooves 88A for holding untreated substrates W are positioned rear of the substrate holding positions of the respective hand elements 70. Then, the guide advancing and retreating mechanism 87 advances the support guides 80 to the tip end sides of the hand elements 70. Accordingly, the substrates Ware sandwiched between the support guides 80 and the first guide projections 75 on the tip ends of the hand elements 70. In this state, the above-described posture change operation is performed. After finishing of the posture change, the guide advancing and retreating mechanism 87 releases the sandwiching of the substrates W by retreating the support guides 80 by a minute distance to the rear side of the hand elements 70. Accordingly, by the substrate holding grooves 88 of the support guides 80, the substrates W are held in the vertical postures. At this time, the substrates W are pressed against the substrate holding grooves 88 due to gravity, so that alignment of the substrates W is achieved at the same time.

[Untreated Substrate Transfer Operation]

During the posture change operation by the carrying in/out mechanism 4, the transfer mechanism 5 makes the support guide shafts 91 on standby at lower positions lower than the hand support 41. At this time, the guide pivotal mechanism 105 controls the pivotal positions of the support guide shafts 91 so that the first contact portions 113 of the pair of support guide shafts 91 are opposed to each other.

When the posture change operation is finished and sandwiching of the substrates W is released, the support guide shafts 91 are raised to upper positions above the batch hand 40 by the actuator 95. In the process of this raising, the multiple substrates W are collectively transferred from the batch hand 40 onto the support guide shafts 91. The width in the X direction of the hand support 41 is smaller than the distance between the pair of support guide shafts 91. Therefore, there is no possibility that the support guide shafts 91 in rising interfere with the hand support 41.

After the substrates Ware transferred, the carrying in/out mechanism 4 returns the batch hand 40 into the horizontal posture directed toward the FOUP holder 1 by driving the swiveling motor 50, and then turns into standby state.

Next, the second horizontal conveyance mechanism 7 moves the second horizontal conveyance holder 160 to the transfer position P3. At this time, for example, it is referred to as a first supporting state that the first guide 135 is positioned higher than the second guide 136.

In this state, the transfer mechanism 5 moves the support guide shafts 91 to the lower positions. In this process, the multiple substrates W held in the vertical postures on the support guide shafts 91 are collectively transferred onto the second horizontal conveyance holder 160. At this time, the second horizontal conveyance holder 160 is referred to as a posture in which the support members of the guides 135 and 136 are along the Y direction that can hold multiple substrates stacked in the Y direction in the vertical postures. The width in the X direction of the second horizontal conveyance holder 160 in this state is smaller than the distance between the pair of support guide shafts 91. Therefore, there is no possibility that the support guide shafts 91 in lowering interfere with the second horizontal conveyance holder 160.

After this transfer, the guide pivotal mechanism 105 of the transfer mechanism 5 pivots the pair of support guide shafts 91 so that the retract portions 115 are opposed to each other. In this state, the transfer mechanism 5 raises and retracts the support guide shafts 91 to the upper positions. The distance between the retract portions 115 of the pair of support guide shafts 91 is longer than the diameter of the substrates W, so that the support guide shafts 91 can retract to the upper positions without interference with the substrates W held on the horizontal conveyance holder 160.

After the support guide shafts 91 are retracted, the second horizontal conveyance mechanism 7 swivels the second horizontal conveyance holder 160 around the vertical axis and retracts the holder 61 from the transfer position P3.

Thus, after the horizontal conveyance holder 160 retracts, the transfer mechanism 5 lowers the support guide shafts 91 to the lower positions to make the shafts 91 on standby. In addition, by the guide pivotal mechanism 105, the pivotal positions of the pair of support guide shafts 91 are controlled so that the first contact portions 113 are opposed to each other.

[Batch Assembly Operation]

The second horizontal conveyance mechanism 7 holds the first 25 substrates W in every other substrate holding groove of the first guide 135. From this state, a batch consisting of 50 substrates W can be formed by receiving the other 25 substrates W in every other empty substrate holding groove. This is referred to as batch assembly.

The second horizontal conveyance holder 160 retracted from the transfer position P3 is horizontally rotated by 180 degrees by the action of the guide rotating motor 150 as appropriate.

On the other hand, the carrying in/out mechanism 4 collectively carries out a plurality of untreated substrates W of another FOUP F disposed in the FOUP holder 1 by the action of the automatic FOUP conveyance device 11. Then, in the same manner as described above, the multiple substrates W are changed in posture from the horizontal postures into the vertical postures and supported at the transfer position P3 by the support guides 80.

In this state, the carrying in/out mechanism 4 moves the support guides 80 along the Y direction by a half distance (half pitch) of the holding interval of the substrates W together with the movable base 63 by the actuator 65. On the other hand, the transfer mechanism 5 moves the support guide shafts 91 in the same direction (Y direction) as the movement direction of the support guides 80 by a half distance of the holding interval of the substrates W by driving the guide moving motor 100. Accordingly, the substrate holding positions of the support guides 80 and the support guide shafts 91 are aligned vertically, and shifted by half pitches along the Y direction from the positions of holding the first 25 substrates W.

From this state, the transfer mechanism 5 raises and guides the support guide shafts 91 to the upper positions. In this process, the support guide shafts 91 collectively scoop the multiple substrates W on the support guides 80.

Next, the carrying in/out mechanism 4 changes the posture of the batch hand 40 into the horizontal posture and retracts the batch hand 40 from the transfer position P.

In this state, the second horizontal conveyance mechanism 7 swivels and moves the second horizontal conveyance holder 160 to the transfer position P3. Thereafter, the transfer mechanism 5 lowers the pair of support guide shafts 91 to the lower positions. In this process, the 25 substrates W held by the support guide shafts 91 are collectively delivered onto the first guide 135 of the second horizontal conveyance holder 160. These 25 substrates W enter gaps between the 25 substrates W that are already held on the second horizontal conveyance holder 160 so as to mesh each other. Accordingly, the 50 substrates W are held on the second horizontal conveyance holder 160 in a stacked state at half pitches in the Y direction.

Thereafter, the second horizontal conveyance mechanism 7 swivels the second horizontal conveyance holder 160 around the vertical axis 172 and opposes the holder 160 to the second substrate delivery position P2, spins the same around the rotation shaft 147 by the guide rotating motor 150, and further moves the same horizontally in the X direction to the second substrate delivery position P2 (see FIG. 20). At this time, the second horizontal conveyance mechanism 7 horizontally rotates the second horizontal conveyance holder 160 so that the multiple substrates W in the vertical postures are turned into a stacked state in the X direction.

[Substrate Delivery at the Second Substrate Delivery Position P2]

Before the second horizontal conveyance holder 160 of the second horizontal conveyance mechanism 7 moves to the second substrate delivery position P2, the first mediating robot 175 makes the support guides 177 on standby at lower positions lower than the second horizontal conveyance holder 160. After the second horizontal conveyance holder 160 moves to the second substrate delivery position P2, the first mediating robot 175 raises the support guides 177 to upper positions higher than the second horizontal conveyance holder 160. In this process, the multiple (50) substrates W stacked at half pitches in the vertical postures are collectively delivered from the second horizontal conveyance holder 160 to the support guides 177.

Thereafter, the second horizontal conveyance mechanism 7 retracts the second horizontal conveyance holder 160 from the second substrate delivery position P2 to prepare for reception of the next untreated substrates W.

On the other hand, the first mediating robot 175 lowers the support guides 177 to lower positions lower than the support guides 183 of the second mediating robot 176. In this process, the multiple (50) substrates are collectively delivered from the first mediating robot 175 to the second mediating robot 176. When the second mediating robot 176 is provided with a substrate orientation alignment mechanism, a substrate orientation alignment operation is further performed.

[Operation of Main Conveyance Mechanism]

The main conveyance mechanism 3 sandwiches and receives multiple (50) untreated substrates W held in the vertical postures on the support guides 183 of the second mediating robot 176 by the substrate chucks 30. The main conveyance mechanism 3 raises the substrate chucks 30 to positions higher than the treatment tanks 21 through 25, further moves the substrate chucks 30 along the Y direction to the first chemical tank 21 or the second chemical tank 23, and collectively delivers the multiple (50) substrates W to the first lifter 27 or the second lifter 28. Thereafter, by the action of the first or second lifter 27 or 28, the multiple (50) substrates W are collectively immersed in the chemical of the chemical tank 21 or 23, and thereafter, immersed in the rinse solution in the rinse solution tank 22 or 24. After substrate treatment with the first chemical stored in the first chemical tank 23, when it is necessary to further apply treatment with the second chemical stored in the second chemical tank 23 or with the first chemical after the treatment with the second chemical, the main conveyance mechanism 3 collectively conveys the multiple (50) substrates W between the first and second lifters 27 and 28.

The substrates W which are completely subjected to rinse treatment in the rinse solution tank 22 or 24 and should be subjected to drying are delivered from the lifter 27 or 28 to the main conveyance mechanism 3, and carried in the drying unit 25 by the main conveyance mechanism 3. Then, treated substrates W are completely treated in the drying unit 25 are carried out of the drying unit 25 by the main conveyance mechanism 3 and conveyed to the first substrate delivery position P1.

The main conveyance mechanism 3 moves to the chuck cleaning unit 8 before carrying the treated substrates W out of the drying unit 25, and inserts the substrate chucks 30 in the cleaning tanks 35 of the chuck cleaning unit 8 to clean the substrate chucks 30. Then, after delivering the treated substrates W to the first horizontal conveyance mechanism 6 at the first substrate delivery position P1, without cleaning the substrate chucks 30, the main conveyance mechanism operates to receive untreated substrates W from the second mediating robot 176 at the second substrate delivery position P2.

[Discharge of Treated Substrates]

When the first horizontal conveyance mechanism 6 makes the first horizontal conveyance holder 120 on standby at the first substrate delivery position P1 (see FIG. 20 and FIG. 21), the main conveyance mechanism collectively delivers a plurality of treated substrates W held by the substrate chucks 30 to the first horizontal conveyance holder 120.

The first horizontal conveyance mechanism which has received the treated substrates W moves horizontally along the X direction and rotates the first horizontal conveyance holder 120 around the vertical axis by 90 degrees to align the holder 120 in the substrate W holding direction (Y direction) in the transfer mechanism 5. Then, the first horizontal conveyance mechanism moves the first horizontal conveyance holder 120 to the transfer position P3.

Previous to this, the transfer mechanism 5 makes the support guide shafts 91 on standby at the lower positions lower than the first horizontal conveyance holder 120. At this time, the guide pivotal mechanism 105 controls the pivotal positions of the support guide shafts 91 so that the second contact portions 114 of the pair of support guide shafts 91 are opposed to each other.

The transfer mechanism 5 raises the support guide shafts 91 to the upper positions above the first horizontal conveyance holder 120 by the actuator 95. In this raising process, the multiple substrates W are collectively transferred from the first horizontal conveyance holder 120 onto the support guide shafts 91. At this time, the first horizontal conveyance holder 120 holds 50 substrates W in the stacked state in the Y direction at half pitches, and alternate 25 substrates of the 50 substrates are collectively transferred onto the support guide shafts 91. Thus, the batch made of 50 substrates W is disassembled into substrate groups each including 25 substrates. This is referred to as batch disassembly. After the batch disassembly operation, the first horizontal conveyance mechanism 6 temporarily once retracts the first horizontal conveyance holder 120 in the X direction (toward the first substrate delivery position P1 side).

Next, the carrying in/out mechanism 4 changes the batch hand 40 from the horizontal posture into the vertical posture at the posture changing position. Accordingly, the batch hand 40 is disposed at the transfer position P3 in the vertical posture. At this time, the batch hand 40 is controlled in advance so that the second support surfaces 72 come to the upper side in the horizontal posture. The support guides 80 are controlled so that the second substrate holding grooves 88B for holding treated substrates W are positioned rear of the substrate holding positions of the respective hand elements 70. As a matter of course, the substrate supporting positions of the substrate guides 80 and the substrate supporting positions of the support guide shafts 91 are controlled to coincide with each other in a plan view.

In this state, the transfer mechanism 5 lowers the support guide shafts 91 from the upper positions to the lower positions lower than the hand support 41. In this process, the multiple (25) substrates W are collectively delivered from the support guide shafts 91 to the support guides 80.

Next, the guide advancing and retreating mechanism 87 of the carrying in/out mechanism 4 advances the support guides 80. Accordingly, the substrates W are sandwiched between the support guides 80 and the second guide projections 76 on the tip ends of the hand elements 70. In this state, the swiveling motor 50 is driven to swivel the batch hand 40 from the vertical posture into the horizontal posture. Thus, the 25 substrates W are changed in posture from the vertical postures into the horizontal postures. After finishing of the posture change, the guide advancing and retreating mechanism 87 retreats the support guides 80 by a minute distance to the rear side of the hand elements 70 to release sandwiching of the substrates W.

The carrying in/out mechanism 4 advances the batch hand 40 along the Y direction toward the FOUP F. Until this time, the automatic FOUP conveyance device 11 arranges an empty FOUP F in which treated substrates W are to be contained in the FOUP holder 1. The batch hand 40 enters the FOUP F and then is lowered by a minute height by the action of the actuator 65. Accordingly, the individual substrates W are contained on the plurality of substrate holding racks formed inside the FOUP F. Thereafter, the batch hand 40 retreats to the outside of the FOUP F and prepares for reception of the next 25 substrates.

At the transfer position P3, in wait for the transfer mechanism 5 to lower the support guide shafts 91 to the lower positions, the first horizontal conveyance mechanism 6 makes the first horizontal conveyance holder 120 enter the transfer position P3 again. At this time, the transfer mechanism 5 moves the support guide shafts 91 in the Y direction by a half pitch such that the positions of the remaining 25 substrates W held on the first horizontal conveyance holder 120 and the substrate supporting positions are consistent with each other. Correspondingly thereto, the carrying in/out mechanism 4 moves the support guides 80 in the Y direction by a half pitch together with the movable base 63.

In the state that the first horizontal conveyance holder 120 enters the transfer position P3 again, the transfer mechanism 5 raises the support guide shafts 91 to the upper positions above the first horizontal conveyance holder 120. In this process, the 25 substrates W held on the first horizontal conveyance holder 120 are collectively delivered to the support guide shafts 91.

Thereafter, when the first horizontal conveyance mechanism 6 retracts the horizontal conveyance holder 120 from the transfer position P3, the carrying in/out mechanism 4 changes the posture of the batch hand 40 from the horizontal posture into the vertical posture to guide to the transfer position P3. From this state, the transfer mechanism 5 lowers the support guide shafts 91 to the lower positions lower than the hand support 41. In this process, 25 substrates W are collectively delivered from the support guide shafts 91 to the support guides 80 below the batch hand 40.

Thereafter, the guide advancing and retreating mechanism 87 of the carrying in/out mechanism 4 advances the support guides 80. Accordingly, the substrates W are sandwiched between the support guides 80 and the second guide projections 76 on the tip ends of the hand elements 70. In this state, the swiveling motor 50 is driven to horizontally swivel the batch hand 40 from the vertical posture to the horizontal posture. Thus, the 25 substrates W are changed in posture from the vertical postures into the horizontal postures. After finishing of the posture change, the guide advancing and retreating mechanism 87 retreats the support guides 80 by a minute distance to the rear side of the hand elements 70 to release the sandwiching of the substrates W.

The carrying in/out mechanism 4 further advances the batch hand 40 along the Y direction toward the FOUP F. Until this time, the automatic FOUP conveyance device 11 arranges an empty FOUP F in which treated substrates W are to be contained on the FOUP holder 1. The batch hand 40 enters the inside of the FOUP F, and then lowers by a minute height. Accordingly, the individual substrates W are contained on a plurality of substrate holding racks formed inside the FOUP F.

Second Embodiment

Figure 25:
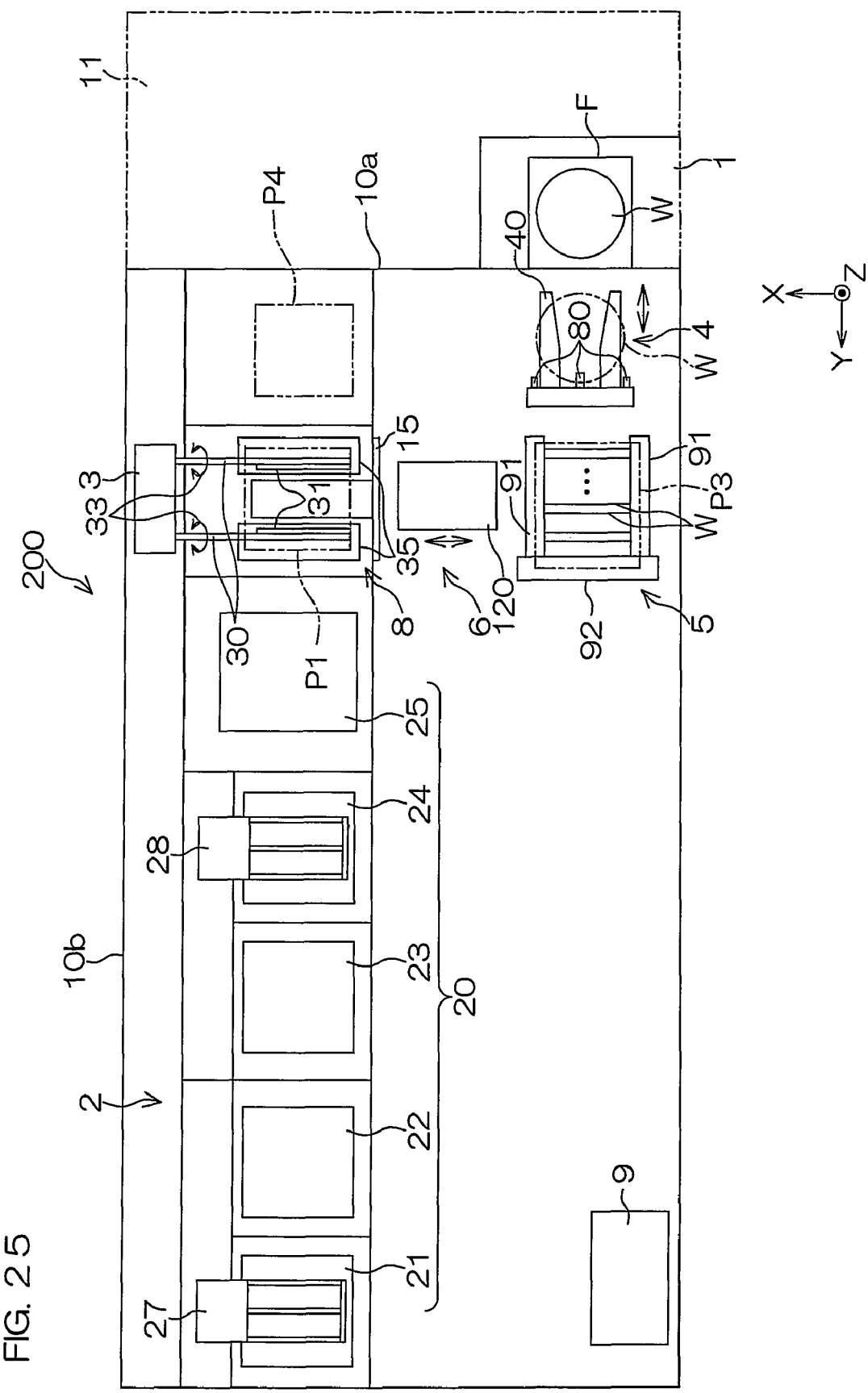
FIG. 25 is a plan view showing a construction of a substrate treatment apparatus of another embodiment of the present invention.
Figure 26:
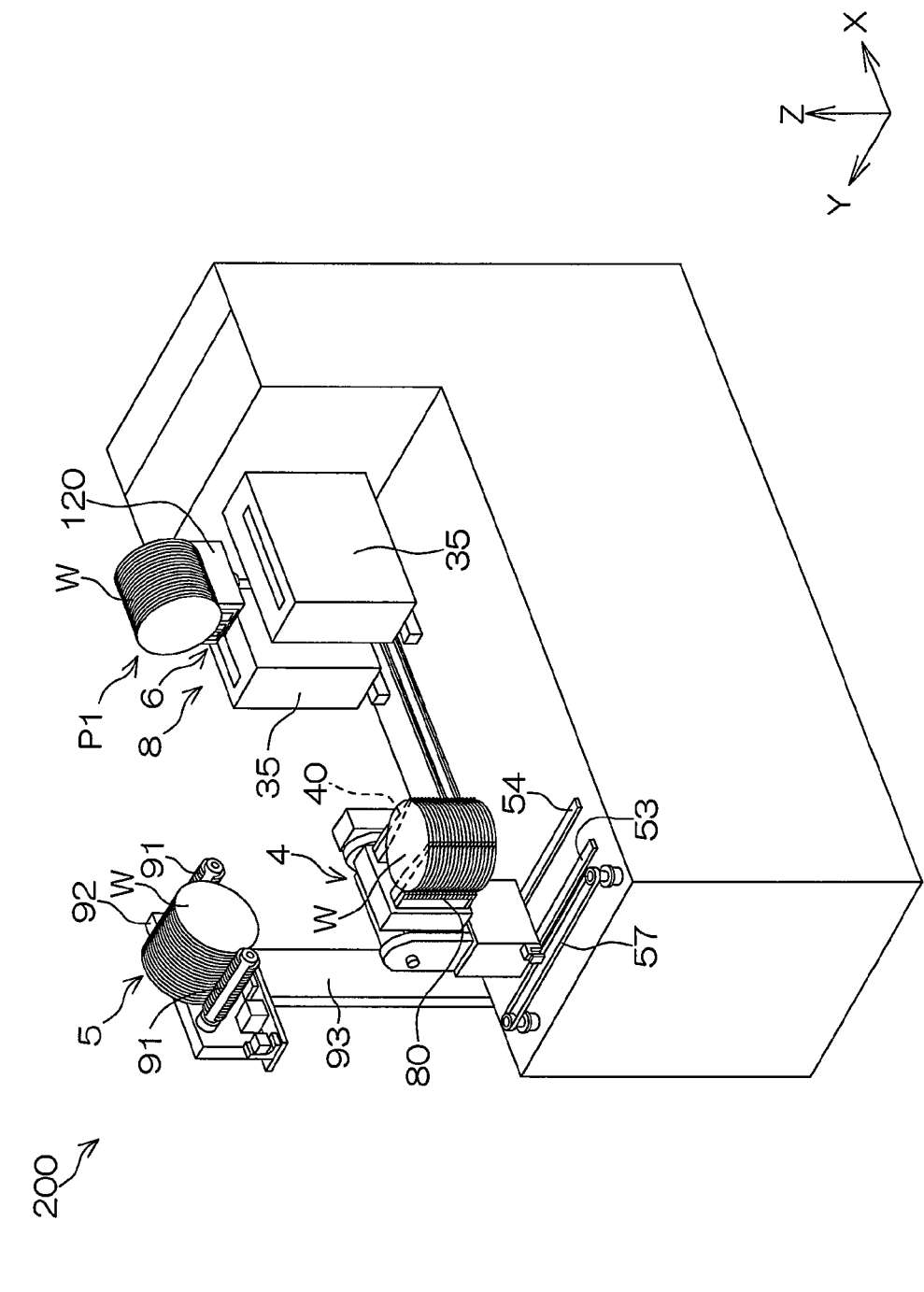
FIG. 26 is a schematic perspective view showing a construction between a FOUP and a substrate delivery position.

FIG. 25 is a plan view showing a construction of a substrate treatment apparatus according to another embodiment of the present invention. FIG. 26 is a schematic perspective view showing a construction between a FOUP and a substrate delivery position.

In the first embodiment described above, the main conveyance mechanism 3 delivers treated substrates W to the first horizontal conveyance mechanism 6 at the first substrate delivery position P1, and receives untreated substrates W conveyed by the second horizontal conveyance mechanism 7 at the second substrate delivery position P2. On the other hand, in the substrate treatment apparatus 200 of the present embodiment, the second horizontal conveyance mechanism 7 is omitted, and only one horizontal conveyance mechanism 6 is provided. This horizontal conveyance mechanism 6 delivers untreated substrates W to the main conveyance mechanism 3 at the substrate delivery position P1, and receives treated substrates W from the main conveyance mechanism 3 also at the substrate delivery position P1. Further, in addition to the batch disassembly operation, the horizontal conveyance mechanism 6 also performs the batch assembly operation that the second horizontal conveyance mechanism 7 performs in the first embodiment.

When holding untreated substrates W, the horizontal conveyance mechanism 6 holds untreated substrates W by the first guide 135 with setting the substrate holding position of the first guide 135 higher than that of the second guide 136. When holding treated substrates W, the horizontal conveyance mechanism 6 holds treated substrates W by the second guide 136 with setting the substrate holding position of the first guide 135 lower than that of the second guide 136.

A substrate orientation alignment mechanism may be disposed at a position P4 corresponding to the second substrate delivery position P2 of the first embodiment. In this case, the main conveyance mechanism 3 receives untreated substrates W from the first horizontal conveyance mechanism 6 at the substrate delivery position P1, and then delivers the untreated substrates W to the substrate orientation alignment mechanism at the position P4. Then, after a substrate orientation alignment operation, the main conveyance mechanism 3 receives the substrates W from the substrate orientation alignment mechanism to convey to the substrate treatment section 2.

Other Embodiments

In the first embodiment, the first and second horizontal conveyance mechanisms 6 and 7 have the first and second guides 135 and 136 and have a construction for switching the guides. However, in the operation of the first embodiment, the first horizontal conveyance mechanism 6 holds and conveys treated substrates W exclusively and the second horizontal conveyance mechanism 7 holds and conveys untreated substrates W exclusively. Therefore, it is not necessary to provide the two substrate holding guides and the construction for switching these, and one substrate holding guide to be normally used is sufficient. However, to increase the substrate conveyance speed, the first and second horizontal conveyance mechanisms 6 and 7 may be both operated so as to convey both of the treated substrates W and the untreated substrates W. In this case, the first and second guides 135 and 136 are switched and used for treated substrates W and untreated substrates W, whereby transfer of foreign bodies onto treated substrates W can be reduced or prevented.

In the first embodiment described above, the first and second mediating robots 175 and 176 are provided for substrate delivery between the second horizontal conveyance mechanism 6 and the main conveyance mechanism 3. However, these may be omitted and substrates are directly delivered between the second horizontal conveyance mechanism 6 and the main conveyance mechanism 3. However, from the viewpoint to enable setting the substrate orientation alignment mechanism as an option and shorten the waiting time of the second horizontal conveyance mechanism 6 at the second substrate delivery position P2, the structure is preferable that is provided with the first and second mediating robots 175 and 176.

Further, the first and second substrate delivery positions P1 and P2 may be interchangeable and the second substrate delivery position for untreated substrates W is arranged on the side closer to the substrate treatment section 2.

In the above-described embodiments, the carrying in/out mechanism 4 moves the support guides 80 by a half pitch for batch assembly. However, after delivery of the substrates W to the transfer mechanism 5, the support guide shafts 91 of the transfer mechanism 5 are moved by a half pitch and then the substrates W are delivered from the support guide shafts 91 to the second horizontal conveyance mechanism 7, whereby batch assembly can be performed. The batch disassembly can be performed in the same manner, so that the half-pitch movement of the support guides 80 is not always necessary.

Further, in the embodiments described above, a FOUP (Front Opening Unified Pod) which contains substrates W in a sealed state is used as a container for containing substrates W. However, the container is not limited to the FOUP, but may be an SMIF (Standard Mechanical Inter Face) pod, OC (Open Cassette) or the like.

In the embodiments described above, as the substrate W, a circular substrate like a substrate wafer is shown as an example. However, as a matter of course, another kind of substrate like a rectangular substrate for liquid crystal panel may be a treatment target.

The embodiments of the present invention are described in detail above. However, these are merely detailed examples used for clarifying the technical contents of the present invention, and the present invention should not be interpreted as being limited to these detailed examples. The spirit and scope of the present invention are limited only by the accompanying claims.

This application corresponds to Japanese Patent Application Nos. 2007-60779 and 2007-60780 filed with Japan Patent Office on Mar. 9, 2007, and Japanese Patent Application No. 2007-321142 filed with Japan Patent Office on Dec. 12, 2007, and full disclosure of these applications are incorporated herein by reference.

What is claimed is:
1. A substrate treatment apparatus comprising:
a container holder which holds a container for containing multiple substrates vertically stacked in horizontal postures;
a substrate treatment section which collectively applies treatment to multiple substrates horizontally stacked in vertical postures;
a main conveyance mechanism which collectively conveys multiple substrates horizontally stacked in vertical postures between a predetermined substrate delivery position and the substrate treatment section, the substrate delivery position including a first substrate delivery position and a second substrate delivery position different from the first substrate delivery position;
a carrying in/out mechanism which collectively carries in/out the multiple substrates with respect to the container held by the container holder and collectively changes postures of the multiple substrates between the horizontal postures and the vertical postures; and
a sub conveyance mechanism which collectively receives and delivers multiple substrates in vertical postures from and to the carrying in/out mechanism at a predetermined transfer position, collectively receives and delivers multiple substrates in vertical postures from and to the main conveyance mechanism at the substrate delivery position, and collectively conveys multiple substrates in vertical postures between the transfer position and the substrate delivery position, wherein
the carrying in/out mechanism includes:
a multiple-substrate holding hand which collectively holds multiple substrates;
a hand advancing and retreating mechanism which advances and retreats the multiple-substrate holding hand along a predetermined advancing and retreating direction along a horizontal direction with respect to the container held by the container holder; and
a hand swiveling mechanism which swivels the multiple-substrate holding hand by at least 90 degrees along a vertical plane along the advancing and retreating direction,
the sub conveyance mechanism includes:
a transfer mechanism which has a transfer support for collectively holding multiple substrates horizontally stacked in vertical postures, and vertically moves the transfer support to collectively receive and deliver multiple substrates in vertical postures from and to the carrying in/out mechanism at the transfer position, the transfer mechanism being disposed on the opposite side of the carrying in/out mechanism with respect to the advancing and retreating direction of the multiple-substrate holding hand;
a first substrate movement mechanism which has a first conveyance holder for holding multiple substrates, collectively receives and delivers multiple substrates between the transfer support and the first conveyance holder at the transfer position, collectively receives and delivers multiple substrates between the main conveyance mechanism and the first conveyance holder at the first substrate delivery position, and moves the first conveyance holder between the transfer position and the first substrate delivery position via a first path; and
a second substrate movement mechanism which has a second conveyance holder for holding multiple substrates, collectively receives and delivers multiple substrates between the transfer support and the second conveyance holder at the transfer position, collectively receives and delivers multiple substrates between the main conveyance mechanism and the second conveyance holder at the second substrate delivery position, and moves the second conveyance holder between the transfer position and the second substrate delivery position via a second path different from the first path.

2. The substrate treatment apparatus according to claim 1, wherein
the multiple-substrate holding hand includes a plurality of hand elements each of which holds one substrate, and each hand element has a first substrate holder on one side of a hand element alignment direction, and a second substrate holder on the other side of the hand element alignment direction; and
the carrying in/out mechanism further includes a hand rotation mechanism which rotates the multiple-substrate holding hand around a predetermined rotation axis so as to reverse a surface and a back of the hand elements.

3. The substrate treatment apparatus according to claim 1, wherein
the carrying in/out mechanism further includes a support guide which supports multiple substrates in vertical postures from below.

4. The substrate treatment apparatus according to claim 3, wherein
the support guide has a pair of substrate holding grooves with respect to each hand element, and
the carrying in/out mechanism further includes a guide drive mechanism which selects either one of the pair of substrate holding grooves for holding substrates by driving the support guide.

5. The substrate treatment apparatus according to claim 1, wherein the transfer mechanism further includes a support horizontal movement mechanism which moves the transfer support in a predetermined distance range along a horizontal direction in which the substrates in the vertical postures are stacked.

6. The substrate treatment apparatus according to claim 1, wherein
the transfer support includes a pair of support guide shafts which hold multiple substrates horizontally stacked in vertical postures from both sides,
each of the support guide shaft has, at circumferentially different positions, a contact portion which comes into contact with the substrates and a retract portion for securing a predetermined distance between the pair of support guide shafts so as to allow the substrates to pass through between the pair of support guide shafts, and
the transfer mechanism further includes a guide pivotal mechanism which pivots the pair of support guide shafts around respective axes.

7. The substrate treatment apparatus according to claim 6, wherein
the contact portion includes a first contact portion and a second contact portion arranged at circumferentially different positions of the support guide shaft.

8. The substrate treatment apparatus according to claim 1, wherein
the first conveyance mechanism further includes a first horizontal rotation mechanism which rotates the first conveyance holder in a range of at least 90 degrees around a first vertical axis, and
the second conveyance mechanism further includes a second horizontal rotation mechanism which rotates the second conveyance holder in a range of at least 90 degrees around a second vertical axis.

9. The substrate treatment apparatus according to claim 8, wherein
the first horizontal rotation mechanism rotates the first conveyance holder in a range of at least 180 degrees around the first vertical axis; and
the second horizontal rotation mechanism rotates the second conveyance holder in a range of at least 180 degrees around the second vertical axis.

10. The substrate treatment apparatus according to claim 1, wherein
the first and second conveyance holders each have a plurality of substrate holding grooves formed at half pitches of substrate holding pitches of the transfer support.

11. The substrate treatment apparatus according to claim 1, wherein
the first and second conveyance holders each includes a first guide which supports multiple substrates horizontally stacked in vertical postures, and a second guide which supports multiple substrates horizontally stacked in vertical postures, and
the first and second conveyance mechanisms each includes a guide elevating mechanism which elevates the first guide relative to the second guide.

12. The substrate treatment apparatus according to claim 1, wherein
the first substrate movement mechanism is arranged to receive substrates after being treated by the substrate treatment section from the main conveyance mechanism at the first substrate delivery position and to deliver the substrates to the transfer mechanism at the transfer position, and
the second substrate movement mechanism is arranged to receive substrates before being treated by the substrate treatment section from the transfer mechanism at the transfer position and to deliver the substrates to the main conveyance mechanism at the second substrate delivery position.

13. The substrate treatment apparatus according to claim 12, wherein
the main conveyance mechanism includes a substrate chuck which collectively holds multiple substrates;
the substrate treatment apparatus further comprising: a chuck cleaning unit for cleaning the substrate chuck of the main conveyance mechanism; and a conveyance control unit which controls operation of the main conveyance mechanism such that substrates after being treated by the substrate treatment section are conveyed to the first substrate delivery position, and then the substrates are conveyed from the second substrate delivery position to the substrate treatment section, and thereafter, the substrate chuck is cleaned by the chuck cleaning unit.

14. The substrate treatment apparatus according to claim 12, further comprising a transfer control unit which performs the steps of:
controlling the carrying in/out mechanism, the transfer mechanism, and the first substrate movement mechanism such that a first substrate group as a part of multiple substrates held by the first conveyance holder is delivered to the transfer support and the first substrate group is delivered from the transfer support to the carrying in/out mechanism, and thereafter, a second substrate group as another part of the multiple substrates held by the first conveyance holder is delivered to the transfer support and the second substrate group is delivered from the transfer support to the carrying in/out mechanism; and
controlling the carrying in/out mechanism, the transfer mechanism, and the second substrate movement mechanism such that a third substrate group is delivered from the carrying in/out mechanism to the transfer support and the third substrate group is delivered from the transfer support to the second conveyance holder, and thereafter, a fourth substrate group is delivered from the carrying in/out mechanism to the transfer support and the fourth substrate group is further delivered from the transfer support to the second conveyance holder and the third substrate group and the fourth substrate group are held on the second conveyance holder.

15. The substrate treatment apparatus according to claim 1, further comprising a mediating mechanism which mediates reception and delivery of substrates between the second conveyance holder and the main conveyance mechanism at the second substrate delivery position.

16. The substrate treatment apparatus according to claim 1, wherein the transfer support of the transfer mechanism collectively holds multiple substrates horizontally stacked in vertical postures, and the transfer mechanism collectively receives and delivers multiple substrates in vertical postures between the transfer support and the carrying in/out mechanism at the transfer position, the first conveyance holder is for horizontally aligning and holding multiple substrates in vertical postures, the first substrate movement mechanism collectively receives and delivers multiple substrates in vertical postures between the transfer support and the first conveyance holder at the transfer position and collectively receives and delivers multiple substrates in vertical postures between the main conveyance mechanism and the first conveyance holder at the first substrate delivery position, and the second conveyance holder is for horizontally aligning and holding multiple substrates in vertical postures, and the second substrate movement mechanism collectively receives and delivers multiple substrates in vertical postures between the transfer support and the second conveyance holder at the transfer position and collectively receives and delivers multiple substrates in vertical postures between the main conveyance mechanism and the second conveyance holder at the second substrate delivery position.

* * * * *